(12) United States Patent
Hong

(10) Patent No.: US 11,546,454 B2
(45) Date of Patent: Jan. 3, 2023

(54) ELECTRONIC DEVICE INCLUDING CONNECTOR MOUNTED ON CIRCUIT BOARD

(71) Applicant: SAMSUNG ELECTRONICS CO., LTD., Suwon-si (KR)

(72) Inventor: Eunseok Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/734,759

(22) PCT Filed: Sep. 11, 2020

(86) PCT No.: PCT/KR2020/012297
§ 371 (c)(1),
(2) Date: Dec. 3, 2020

(87) PCT Pub. No.: WO2021/049904
PCT Pub. Date: Mar. 18, 2021

(65) Prior Publication Data
US 2021/0234950 A1    Jul. 29, 2021

(30) Foreign Application Priority Data
Sep. 11, 2019  (KR) .......................... 10-2019-0113078

(51) Int. Cl.
*H05K 5/00*     (2006.01)
*H04M 1/02*    (2006.01)
(Continued)

(52) U.S. Cl.
CPC ....... *H04M 1/0277* (2013.01); *H04M 1/0274* (2013.01); *H05K 1/0218* (2013.01); *H05K 1/115* (2013.01)

(58) Field of Classification Search
CPC .............. H04M 1/0277; H04M 1/0274; H05K 1/0218; H05K 1/115
See application file for complete search history.

(56) References Cited

U.S. PATENT DOCUMENTS 6,385,054 B1 * 5/2002 Vesamaki ............. H01M 50/20
361/816
8,325,486 B2 * 12/2012 Arshad ................ H05K 5/0208
361/796
(Continued)

FOREIGN PATENT DOCUMENTS

| JP | 2003-157938 | 5/2003 |
| JP | 2010080691 | 4/2010 |

(Continued)

OTHER PUBLICATIONS

Search Report and Written Opinion dated Jan. 8, 2021 in counterpart International Patent Application Patent Application No. PCT/KR2020/012297.

*Primary Examiner* — Binh B Tran
(74) *Attorney, Agent, or Firm* — Nixon & Vanderhye, P.C.

(57) ABSTRACT

Various embodiments of the present disclosure relate to an electronic device which may include: a circuit board; at least one electronic component mounted on the upper surface of the circuit board; at least one connector mounted on the upper surface of the circuit board and electrically connected to the circuit board or the at least one electronic component; and a conductive frame which includes a side wall surrounding a space, in which the at least one electronic component and the at least one connector are disposed, and an extension part extending from one end of the side wall into the space.

18 Claims, 16 Drawing Sheets

(51) Int. Cl.
*H05K 1/02* (2006.01)
*H05K 1/11* (2006.01)

(56) References Cited

U.S. PATENT DOCUMENTS

| | | |
|---|---|---|
| 10,172,249 B1 | 1/2019 | Ju et al. |
| 10,653,046 B2 | 5/2020 | Hong |
| 2008/0102701 A1 | 5/2008 | Suzuki et al. |
| 2008/0158804 A1* | 7/2008 | Chen .................... G06F 1/1637 361/748 |
| 2009/0002952 A1* | 1/2009 | Mesmer ............... H05K 1/0216 361/720 |
| 2009/0034218 A1* | 2/2009 | Hu ......................... H05K 1/141 361/772 |
| 2009/0080163 A1* | 3/2009 | Lyons ................... H05K 1/141 361/721 |
| 2009/0168386 A1 | 7/2009 | Suzuki et al. |
| 2017/0372979 A1 | 12/2017 | Gandhi |
| 2018/0084680 A1 | 3/2018 | Jarvis et al. |
| 2018/0376581 A1* | 12/2018 | Fujioka ................. H05K 1/115 |

FOREIGN PATENT DOCUMENTS

| | | |
|---|---|---|
| JP | 2010080691 A * | 4/2010 |
| KR | 10-2007-0057278 | 6/2007 |
| KR | 10-2015-0009728 | 1/2015 |
| KR | 10-2016-0120495 | 10/2016 |
| KR | 20190099739 | 8/2019 |
| KR | 10-2019-0139653 | 12/2019 |

* cited by examiner

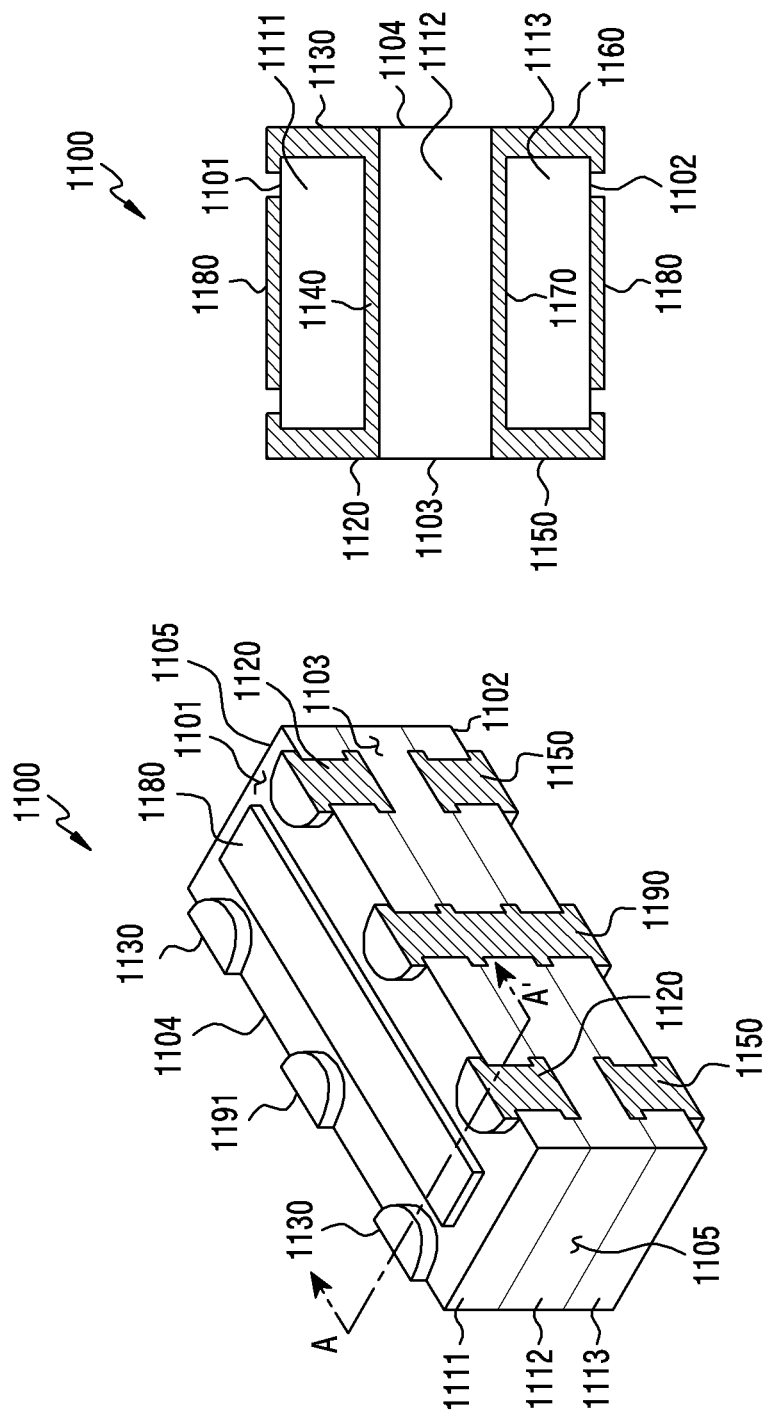

ELECTRONIC DEVICE INCLUDING CONNECTOR MOUNTED ON CIRCUIT BOARD

This application is the U.S. national phase of International Application No. PCT/KR2020/012297 filed 11 Sep. 2020, which designated the U.S. and claims priority to KR Patent Application No. 10-2019-0113078 filed 11 Sep. 2019, the entire contents of each of which are hereby incorporated by reference.

FIELD

The disclosure relates to an electronic device including a connector and a shield can.

DESCRIPTION OF RELATED ART

Portable electronic devices are typically designed to be conveniently used by users, to be trendy, to be thinner, and to support various types of wireless mobile communication services using various frequency bands. In particular, in order to ensure a mounting space of a mobile communication terminal employing a millimeter wave (mmWave) module, a portable electronic device may include a substrate on which various types of electronic components are mounted and a connector, such as a communication port, which is provided to exchange data or the like.

For mounting various electronic components, a structure in which different substrates are stacked is widely applied to make effective use of a small mounting space. Further, a connector such as an interposer is used to electrically connect different substrates to each other.

SUMMARY

In an antenna structure used for a next-generation (e.g. millimeter wave communication) system, wiring may be affected by the type and/or arrangement of nearby electronic components due to frequency characteristics. In particular, in the conventional connector structures, an empty space due to a manufacturing method is inevitably generated between a substrate and a substrate (hereinafter, referred to as a "stacked-PCB structure), and noise may be emitted through the space. The next-generation communication system uses a relative high frequency, and thus antenna performance may be deteriorated due to the degradation of peripheral components by the noise.

Embodiments of the disclosure provide an electronic device and method capable of maintaining antenna performance by preventing generation of an empty space between substrates.

The technical subjects described in the disclosure may not be limited to the above mentioned technical subjects, and other technical subjects which are not mentioned may be clearly understood, through the following descriptions, by those skilled in the art to which the disclosure pertains.

The above information is presented as background information only to assist with an understanding of the disclosure. No determination has been made, and no assertion is made, as to whether any of the above might be applicable as prior art with regard to the disclosure.

An electronic device according to various example embodiments may include: a circuit board; at least one electronic component mounted on an upper surface of the circuit board; at least one connector mounted on the upper surface of the circuit board and electrically connected to the circuit board or the at least one electronic component; and a conductive frame which includes a side wall surrounding a space, in which the at least one electronic component and the at least one connector are disposed, and an extension part extending from one end of the side wall into the space.

An electronic device according to various example embodiments may include: a circuit board; a sub-circuit board spaced apart from the circuit board while facing a first surface of the circuit board; at least one electronic component mounted on at least one surface of the circuit board; at least one connector which is mounted on the first surface of the circuit board, is electrically connected to the circuit board, the sub-circuit board, or the at least one electronic component, and is disposed between the circuit board and the sub-circuit board; and a conductive frame which includes a side wall surrounding a space, in which the at least one electronic component and the at least one connector are disposed, and an extension part extending from one end of the side wall into the space.

Various respective aspects and features of the invention are defined in the appended claims. Combinations of features from the dependent claims may be combined with features of the independent claims as appropriate and not merely as explicitly set out in the claims.

Furthermore, one or more selected features of any one embodiment described in this disclosure may be combined with one or more selected features of any other embodiment described herein, provided that the alternative combination of features at least partially alleviates the one or more technical problem discussed in this disclosure or at least partially alleviates a technical problem discernable by the skilled person from this disclosure and further provided that the particular combination or permutation of embodiment features thus formed would not be understood by the skilled person to be incompatible.

Two or more physically distinct components in any described example implementation of this disclosure may alternatively be integrated into a single component where possible, provided that the same function is performed by the single component thus formed. Conversely, a single component of any embodiment described in this disclosure may alternatively be implemented as two or more distinct components to achieve the same function, where appropriate.

It is an aim of certain embodiments of the invention to solve, mitigate or obviate, at least partly, at least one of the problems and/or disadvantages associated with the prior art. Certain embodiments aim to provide at least one of the advantages described below.

According to various example embodiments, a conductive frame, which encloses a space between a substrate and a substrate (hereinafter, referred to as a "stacked PCB") and is grounded to a substrate, is effectively shielded, and thus can have a more improved noise-blocking effect than that of the conventional stacked-PCB structures according to the prior art.

According to various example embodiments, the improved conductive frame can provide a structure favorable for ensuring durability of a stacked-PCB structure.

According to various example embodiments, in the stacked-PCB structure, one surface of the conductive frame can be surface-mounted on one circuit board and thus can prevent the conductive frame and the circuit board from becoming unfastened or prevent the conductive frame from being warped.

BRIEF DESCRIPTION OF THE DRAWINGS

FIG. 11A illustrates a PCB usable as a connector of an example electronic device according to various embodiments FIG. 11B is a cross-sectional view taken along line A-A' of the connector in FIG. 11A.

DETAILED DESCRIPTION OF EXAMPLE EMBODIMENTS

Hereinafter, various example embodiments will be described with reference to the accompanying drawings.

Figure 1:
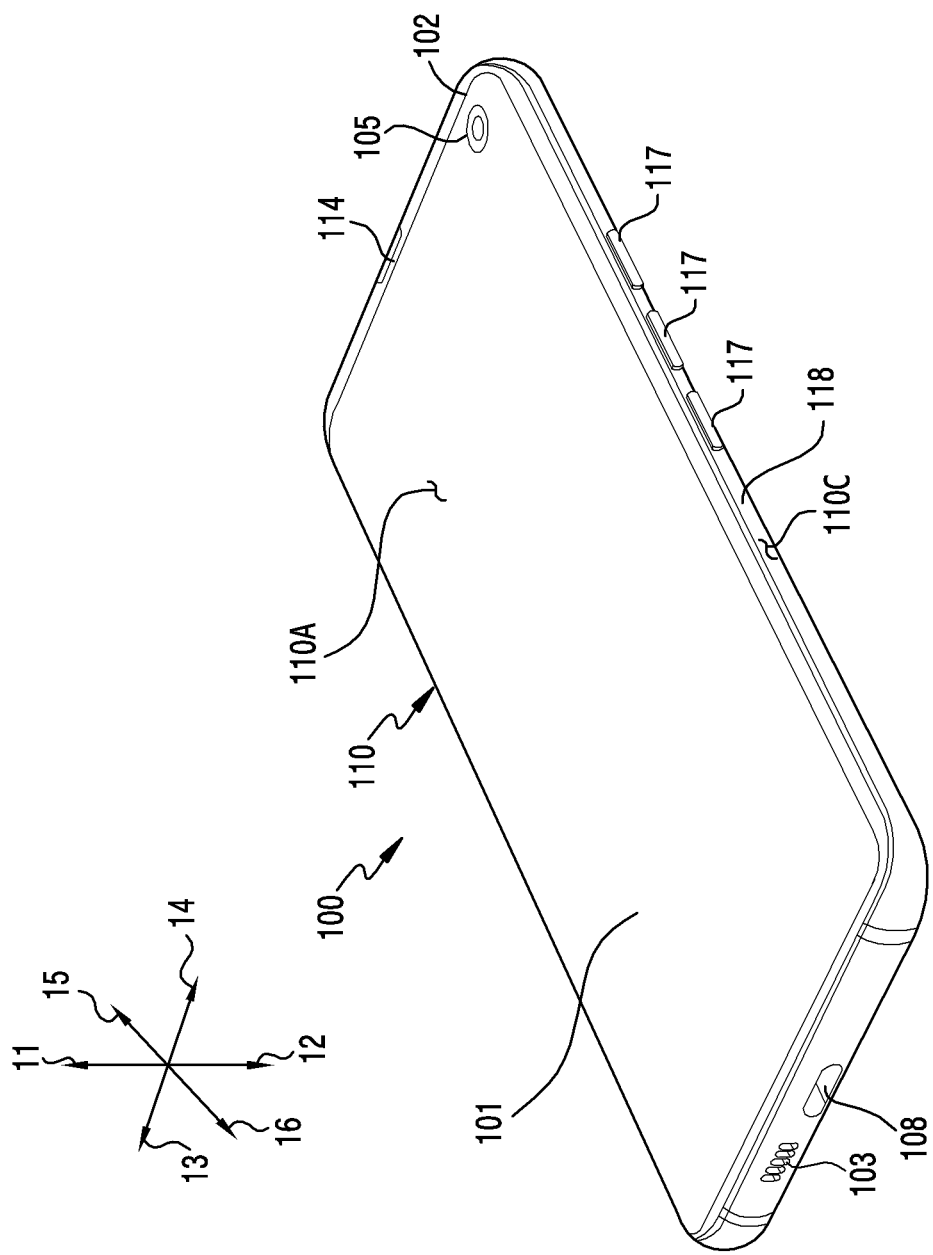
FIG. 1 is a perspective view illustrating a front surface of an example mobile electronic device according to various embodiments.
Figure 2:
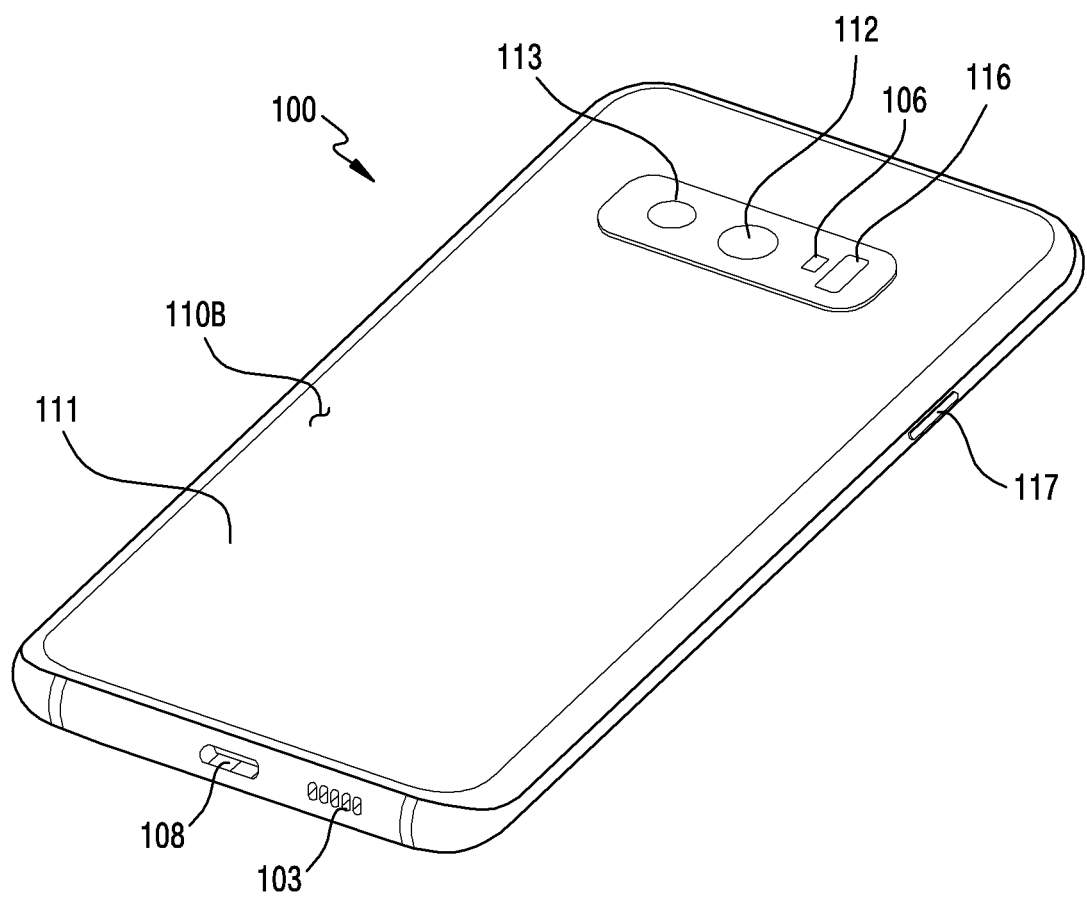
FIG. 2 is a perspective view illustrating a rear surface of the example electronic device in FIG. 1.

FIG. 1 is a perspective view of an example electronic device 100 according to various embodiments. FIG. 2 is a perspective view of the rear surface of the electronic device 100 in FIG. 1.

Referring to FIGS. 1 and 2, the electronic device 100 according to one example embodiment may include a housing 110 including: a first surface (or a front surface) 110A; a second surface (or a rear surface) 110B; and a side surface (or a side wall) 110C surrounding the space between the first surface (or the front surface) 110A and the second surface (or the rear surface) 110B. In another embodiment (not shown), the housing may refer to a structure forming some of the first surface 110A, the second surface 110B, and the side surface 110C in FIG. 1.

According to one example embodiment, the first surface 110A may be formed of a front plate 102 (e.g. a polymer plate or a glass plate including various coating layers), at least a part of which is substantially transparent. According to an embodiment, the front plate 102 may include, at least one side edge portion thereof, a curved portion which is bent and seamlessly extends from the first surface 110A toward a rear plate 111.

According to one example embodiment, the second surface 110B may be formed of the rear plate 111 which is substantially opaque. The rear plate 111 may be formed of, for example, coated or colored glass, ceramic, polymer, metal (e.g. aluminum, stainless steel (STS), or magnesium), or a combination of at least two of the above-described materials. According to an example embodiment, the rear plate 111 may include, at least one side edge portion thereof, a curved portion which is bent and seamlessly extends from the second surface 110B toward the front plate 102.

The side surface 110C is coupled to the front plate 102 and the rear plate 111, and may be formed of a side bezel structure (or "a side member or side wall") 118 which contains metal and/or polymer. In an example embodiment, the rear plate 111 and the side bezel structure 118 may be integrally formed and may contain the same material (e.g. a metal material such as aluminum).

According to one example embodiment, the electronic device 100 may include at least one among: a display 101; openings 103 and 114 associated with one or more audio modules; a camera device 105 associated with one or more camera modules; key input devices 117; and a connector hole 108. In an example embodiment, in the electronic device 100, at least one (e.g. the key input devices 117) of the elements may be omitted or another element may be additionally included. For example, in a region provided by the front plate 102, a sensor such as a proximity sensor or an illuminance sensor may be integrated with the display 101, or may be disposed at a position adjacent to the display 101. In an embodiment, the electronic device 100 may further include a light-emitting element, and the light-emitting element may be disposed at a position adjacent to the display 101 in a region provided by the front plate 102. The light-emitting element may provide, for example, state information of the electronic device 100 in the form of light. In another example embodiment, the light-emitting element may provide, for example, a light source which operates in cooperation with operation the camera device 105. The light-emitting element may include, for example, an LED, an IR LED, and a xenon lamp.

The display 101 may be exposed through, for example, a considerable portion of the front plate 102. In an example embodiment, the edge of the display 101 may be formed to have a shape approximately identical to the shape (curve) of an outer edge of the front plate 102 adjacent thereto. In another example embodiment (not shown), in order to increase an exposed area of the display 101, the gaps between the outer edges of the display 101 and the outer edges of the front plate 102 may be formed to be approximately equal to each other. In another example embodiment (not shown), a recess or an opening is formed in a part of the screen display region of the display 101, and the electronic device may include other electronic components aligned with the recess or the opening, such as the camera module 105 or a proximity sensor or illuminance sensor (not shown).

In another example embodiment (not shown), at least one of camera devices 112 and 113, a fingerprint sensor 116, and a flash 106 may be included in the rear surface of the electronic device 100. In another example embodiment (not shown), the display 101 may be coupled to or disposed adjacent to a touch sensing circuit, a pressure sensor capable of measuring the strength (pressure) of touch, and/or a digitizer for detecting a stylus pens using a magnetic field.

The openings 103 and 114 for the audio modules may include a microphone hole and a speaker hole. A microphone for acquiring external sound may be disposed in the microphone hole, and in an example embodiment, multiple microphones may be disposed so as to sense the direction of sound. In an example embodiment, the speaker hole and the microphone hole may be implemented as one hole 103, or a speaker (e.g. a Piezo speaker) may be included without any speaker hole. The speaker hole may include an outer speaker hole and a calling receiver hole 114.

The electronic device 100 may include the unillustrated sensor module (or sensor modules) so as to generate an electrical signal or a data value, which corresponds to an operation state inside the electronic device 100 or an environment state outside the electronic device 100. The sensor modules may further include, for example, a proximity sensor disposed on the first surface 110A of the housing 110, a fingerprint sensor integrated with or disposed adjacent to the display 101 or on the rear surface as shown in FIG. 2, and/or a biometric sensor (e.g. an HRM (heart rate monitor) sensor) disposed on the second surface 110B of the housing 110. The electronic device 100 may further include at least one of other unillustrated sensor modules, for example, a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules may include: a first camera device 105 disposed on the first surface 110A of the electronic device 100; and second camera devices 112 and 113 and/or a flash 106, disposed on the second surface 110B. Each of the camera devices 105, 112, and 113 may include one or multiple lenses, an image sensor, and/or an image signal processor. The flash 106 may include, for example, a light-emitting diode or a xenon lamp. In an example embodiment, two or more lenses (an infrared camera, wide-angle and telephoto lenses) and image sensors may be disposed on one surface of the electronic device 100.

The key input devices 117 may be disposed on the side surface 110C of the housing 110. In another example embodiment, the electronic device 100 may not include some or all of the above-described key input devices 117, and the key input device 117, which is not included in the electronic device 100, may be implemented as another type of element, such as a soft key, on the display 101. In an example embodiment, the key input devices may include at least a part of the fingerprint sensor 116 disposed at the second surface 110B of the housing 110.

The connector holes 108 may receive a connector for transmitting or receiving power and/or data to or from an external electronic device and/or a connector for transmitting or receiving an audio signal to or from an external electronic device. For example, the connector hole 108 may include a USB connector or an earphone jack.

Figure 3:
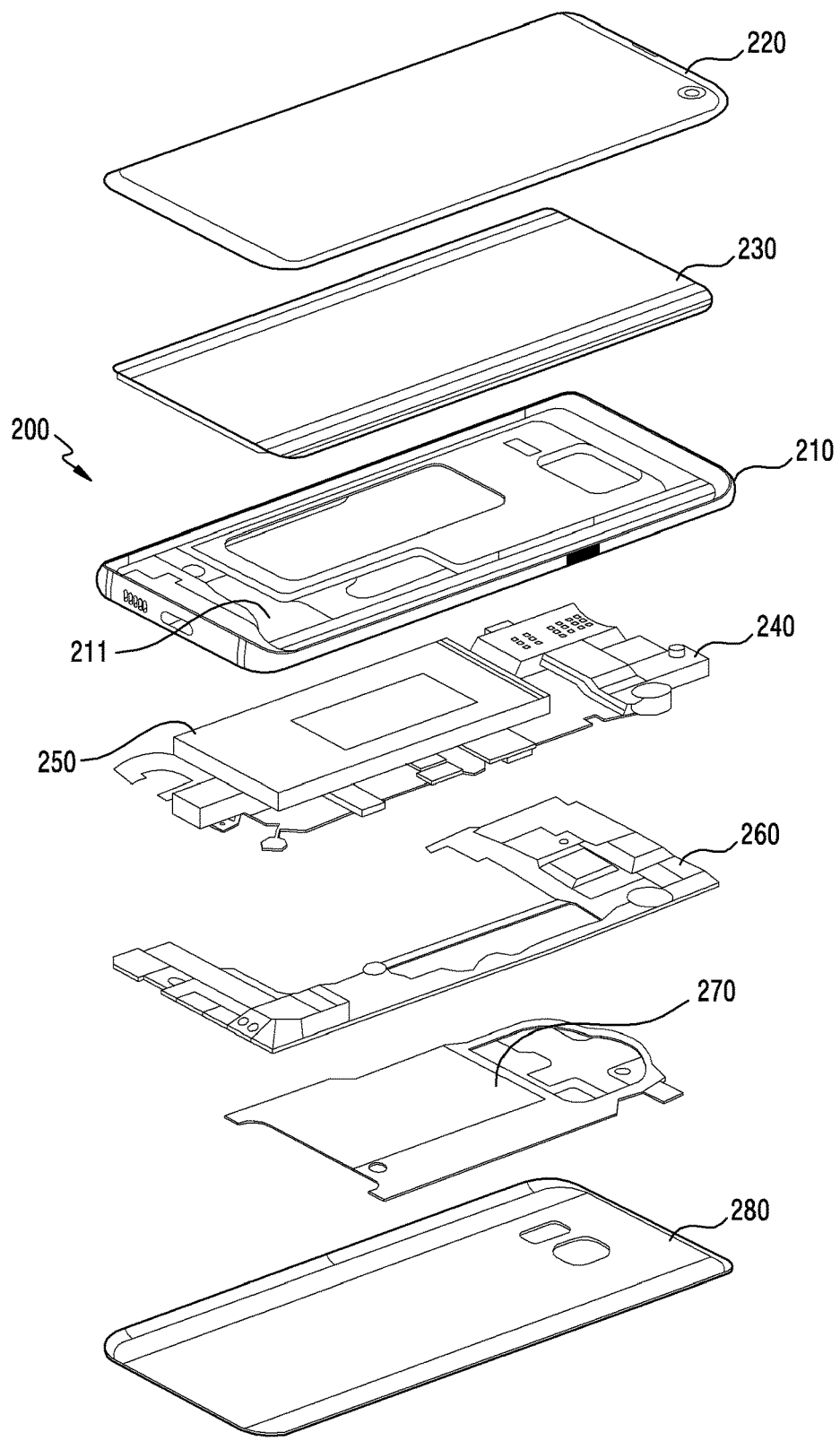
FIG. 3 is an exploded perspective view of the example electronic device FIG. 1.

Referring to FIG. 3, an example electronic device 200 may include: a side bezel structure 210; a first support member 211 (e.g., a bracket); a front plate 220; a display 230; a printed circuit board 240; a battery 250; a second support member 260 (e.g., a rear case); an antenna 270; and a rear plate 280. In an example embodiment, in the electronic device 200, at least one (e.g., the first support member 211 or the second support member 260) of the elements may be omitted, or another element may be additionally included. At least one of the elements of the electronic device 200 may be the same as or similar to at least one of the elements of the electronic device 100 in FIG. 1 or 2. Thus, hereinafter, a redundant description will be omitted.

The first support member 211 may be disposed inside the electronic device 200 and connected to the side bezel structure 210, or may be formed integrally with the side bezel structure 210. The first support member 211 may be formed of, for example, a metal material and/or non-metal (e.g. polymer) material. The first support member 211 may have one surface to which the display 230 is coupled, and another surface to which the printed circuit board 240 is coupled. A processor, a memory, and/or an interface may be mounted on printed circuit board 240. The processor may include at least one of, for example, a central processing unit, an application processor, a graphics-processing unit, an image signal processor, a sensor hub processor, or a communication processor.

The memory may include, for example, volatile memory or nonvolatile memory.

The interface may include, for example, a high definition multimedia interface (HDMI), a universal serial bus (USB) interface, an SD card interface, and/or an audio interface. The interface may electrically or physically connect the electronic device 200 to an external electronic device, and may include a USB connector, an SD card/MMC connector, or an audio connector.

The battery 250 is a device for supplying power to at least one element of the electronic device 200, and may include, for example, a non-rechargeable primary battery, a rechargeable secondary battery, or a fuel cell. At least a part of the battery 250 may be disposed, for example, on substantially the same plane together with the printed circuit board 240. The battery 250 may be integrally disposed inside the electronic device 200, or may be detachably disposed in the electronic device 200.

The antenna 270 may be disposed between the rear plate 280 and the battery 250. The antenna 270 may include, for example, a near field communication (NFC) antenna, a wireless charging antenna, and/or a magnetic secure transmission (MST) antenna. The antenna 270 may perform, for example, short-range communication with an external device, or may transmit or receive power necessary for charging to or from the external device in a wireless manner. In another embodiment, an antenna structure may be formed by a part of the side bezel structure 210 and/or the first support member 211 or a combination thereof.

According to one example embodiment, the processor may be understood as a control unit. The processor according to an embodiment may include at least one of an application processor (AP) and a communication processor (CP) that control functions of the electronic device 200. The memory according to an embodiment may be understood as a storage unit. The memory according to an embodiment may be understood as various types of storage units that store data of the electronic device 200. The display 230 according to an exemplary embodiment may be understood as a display unit. The display 230 according to an embodiment may include a display unit indicating contents on the screen of the electronic device 200.

Figure 4:
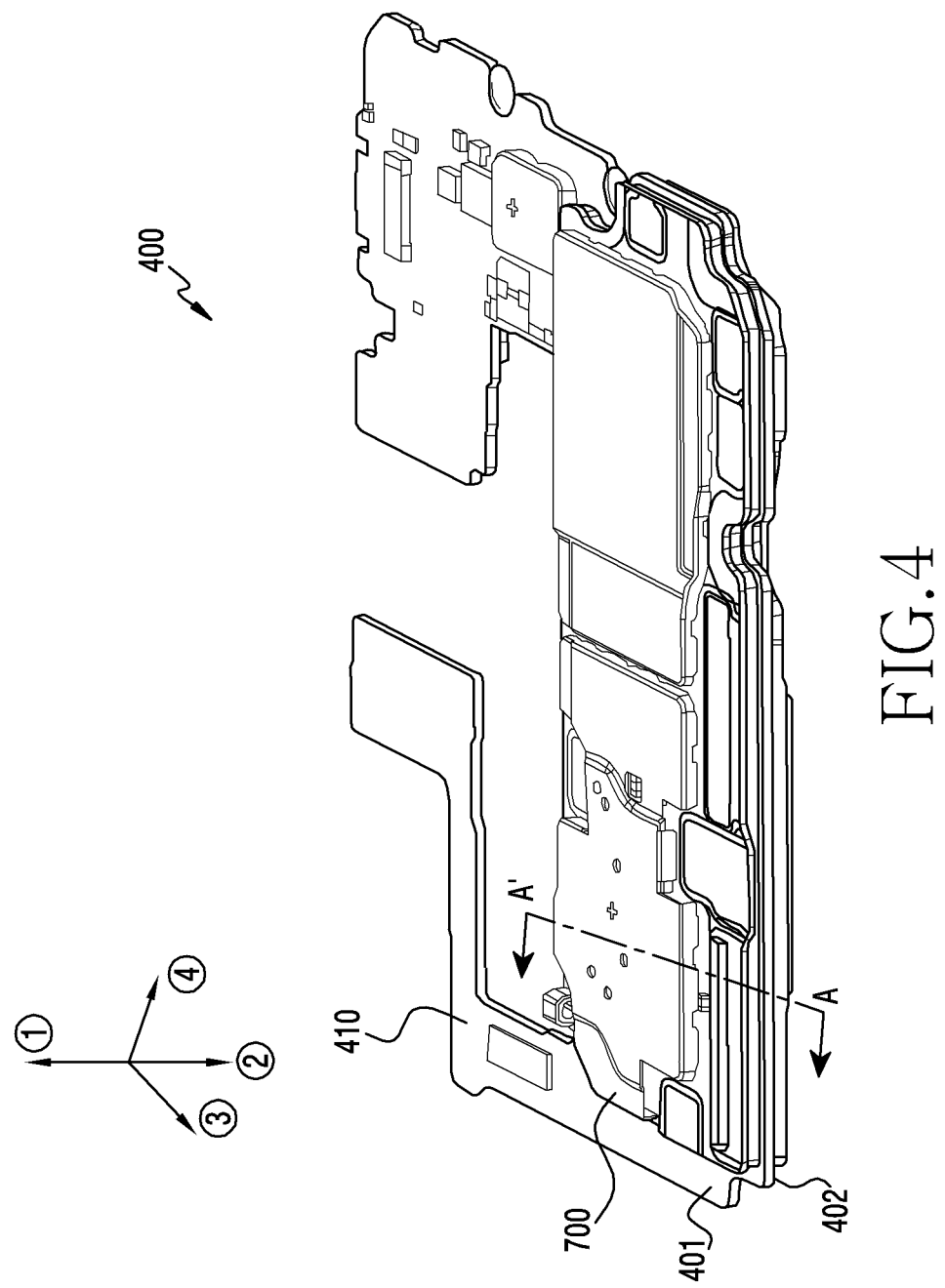
FIG. 4 is a perspective view of an example electronic device including a connector according to various embodiments.
Figure 5:
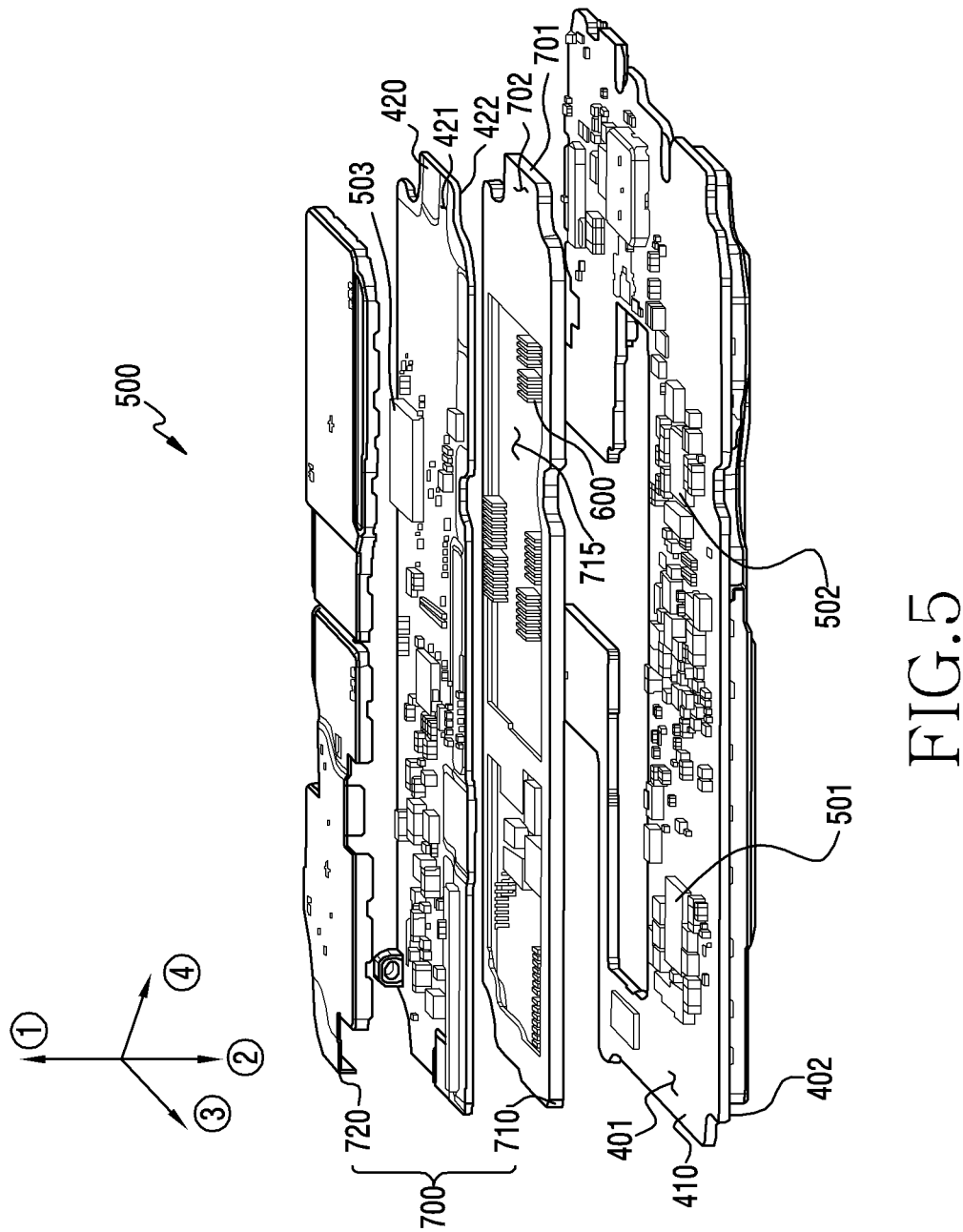
FIG. 5 is an exploded perspective view of an example electronic device including a connector according to embodiments different from FIG. 4.
Figure 6:
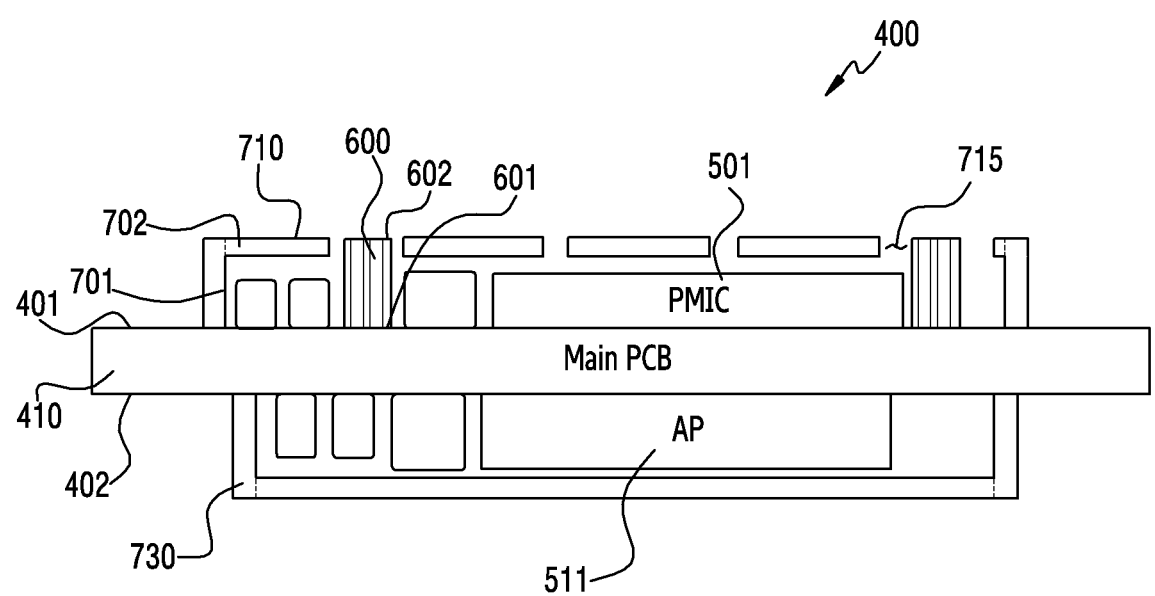
FIG. 6 is a schematic cross-sectional view taken along line A-A' of the example electronic device of FIG. 4.

FIG. 4 is a perspective view of an example electronic device including a connector according to various example embodiments. FIG. 5 is an exploded perspective view of an example electronic device including a connector according to embodiments different from FIG. 4. FIG. 6 is a schematic cross-sectional view taken along line A-A' of the electronic device of FIG. 4

According to various example embodiments, an electronic device 400 may include: a printed circuit board 410 (hereinafter, referred to as a "circuit board"); at least one electronic component 501, 502, and/or 503; and at least one connector 600 (an example, connecting member).

Referring to FIG. 4, the circuit board 410 may include: an upper surface 401 facing a first direction $\hat{1}$; and a lower surface 402 facing a second direction $\hat{2}$ opposite to the first direction $\hat{1}$. According to one example embodiment, the first direction may be toward the first surface 110A of the electronic device 100 or the second surface 110B of the electronic device 100.

According to one example embodiment, the shape of the circuit board 410 is not limited to any specific shape. The printed circuit board 240 of FIG. 3 is illustrated as a circuit board having a ▢-shape (or a C-shape or a U-shape) surrounding the battery 250, but may be formed in various shapes (including an atypical shape) such as a shape (for example, a ¬-shape, a L-shape, or a rectangular shape) which is different from the shape illustrated in FIG. 3.

According to one example embodiment, the at least one electronic component 501 or 502 and the at least one connector 600 may be mounted on the upper surface 401 of the circuit board 410. The fact that the electronic component 501 or 502 or the connector 600 is mounted on the circuit board 410 may refer to an electronic component or the connector being fixed in a specific position on the circuit board 410. For example, an insert mounting (through-hole device (THD)) method for coupling the lower portion of the electronic component or a fastening part provided on the lower portion of the connector to a fastening structure provided on the circuit board 410 may be applied, and a surface mounting (surface mounted device (SMD)) method for forming a solder joint by a reflow process may also be applied. As described above, the shape of the circuit board 410 may be variously changed. Therefore, a position in which the at least one electronic component or the at least one connector is disposed, or the arrangement thereof may be variously changed depending on the shape of the circuit board 410.

According to one embodiment, two or more circuit boards 410 may be provided. When two or more circuit boards 410 are provided, the circuit boards 410 may be stacked on each other. As in an example illustrated in FIG. 5, when the circuit board 410 (or a first substrate) and a sub-circuit board 420 (or a second substrate) are provided, the circuit board 410 and the sub-circuit board 420 may be stacked on each other. According to one embodiment, the upper surface 401 of the circuit board 410 and a lower surface 422 of the sub-circuit board 420 may face each other.

According to one embodiment, when two circuit boards 410 and 420 are provided, at least one electronic component may be mounted on the circuit board 410, and at least one electronic component (not shown) may be mounted on the sub-circuit board 420. The two circuit boards 410 and 420 may face each other in the state in which the electronic components are mounted on each of the two circuits 410 and 420. In this case, the upper surface 401 of the first substrate 410 and the lower surface 422 of the sub-circuit board 420 may face each other.

According to one example embodiment, the electronic components mounted on the circuit board 410 and the sub-circuit board 420, respectively may be alternately arranged such that the electronic components do not physically interfere with each other. In another example, when the electronic components are not tall and thus do not physically interfere with each other, the electronic components mounted on the circuit board 410 and the sub-circuit board 420, respectively may face each other. According to one embodiment, the electronic components mounted on the two circuit board 410 and 420, respectively may also be disposed so as to minimize interference with each other in consideration of electromagnetic influence. According to the embodiment described above, the electronic device 400 (e.g. the electronic device 100 in FIG. 1) including various electronic components may increase space usability.

According to one example embodiment, at least one electronic component may be mounted on the circuit board 410. In the examples illustrated in FIGS. 4 and 5, when three different electronic components 501, 502, and 503 are provided, the electronic components 501, 502, and 503 may be independently connected to the connector 600, or may be connected to the connector 600 while being linked with another electronic component.

The type and shape of the electronic component 501, 502, or 503 are not limited to a specific type and shape. The electronic components 501, 502, and 503 may include, for example, a communication device, a processor, a memory, a radio frequency transceiver (RF transceiver), a power management module, a wireless communication circuit, and/or an interface. The processor may include, for example, at least one of a central processing unit, an application processor, a graphics processing unit, an image signal processor, a sensor hub processor, or a communication processor. According to one example embodiment, the processor may include at least a communication processor, or may be an element in which an application processor is integrated with a communication processor. The processor may control or drive the radio transceiver, the power management module, the wireless communication circuit, etc.

According to one example embodiment, the electronic component 503 disposed on an upper surface 421 of the sub-circuit board 420 is an element for a next-generation communication system, and may be, for example, a millimeter wave communication device (e.g. an RFIC module) for performing wireless communication in a frequency band of about 20 GHz to about 100 GHz.

According to one example embodiment, the connector 600 may electrically/structurally connect different substrates, each of which has a stacked-PCB structure, to each other. For example, the connector 600 disposed between the circuit board 410 and the sub-circuit board 420 may electrically connect the circuit board 410 to the sub-circuit board 420.

According to one example embodiment, the connector 600 may include an interposer connector. According to one example embodiment, the connector 600 may be made of an insulating material containing silicon (Si), glass, or ceramic, and conductive terminals may be packaged together with the insulating material and may be mounted on the circuit board 410. According to one example embodiment, when the connector 600 is formed as an interposer connector, the connector 600 may be used while being surface-mounted (an SMD) on the circuit board 410 made of an organic material. Using the interposer connector may provide mechanical flexibility and/or an electrical connection between a semiconductor chip and a circuit board. According to various example embodiments, the connector 600 may be physically fastened to the circuit board 410. For example, the connector 600 may be coupled to a groove or a fastening member formed on a circuit board in a snap-coupling, hook-coupling, or fitting manner. The connector 600 may be surface-mounted to both the circuit board 410 and the sub-circuit board 420 at both ends thereof by surface mounting, or may be surface-mounted and coupled to only one of the circuit board 410 and the sub-circuit board 420 and may be physically coupled to the other. Even when the connector 600 is physically fastened to the circuit board 410 and the sub-circuit board 420, a terminal part of the connector 600 may be fastened to and be in contact with a terminal part of each of the circuit board 410 and the sub-circuit board 420.

According to one example embodiment, the example electronic device 400 (e.g. the electronic device 100 in FIG.

1) may further include a conductive frame 700 for shielding the electronic components 501, 502, and 503 from noise inside/outside the electronic device 400, in addition to the at least one electronic component 500 and the at least one connector 600. Since the conductive frame 700 may shield an inner space formed by a stacked-PCB structure in a state in which the conductive frame 700 is grounded to the circuit board 410, the conductive frame 700 may improve noise-blocking performance of the electronic device 400.

According to one example embodiment, the conductive frame 700 may include a first shield can 710 and a second shield can 720. The first shield can 710 may be disposed between the circuit board 410 and the sub-circuit board 420. For example, the first shield can 710 may be surface-mounted on the lower surface 422 of the sub-circuit board 420, and may be coupled to the upper surface 401 of the circuit board 410. The first shield can 710 may be connected to a ground part of the circuit board 410 or of the sub-circuit board 420 so as to shield the inner space of the PCB structure from electromagnetic waves.

According to one example embodiment, the first shield can 710 may be disposed on the upper surface 401 of the circuit board 410 so as to cover at least one electronic component 501 or 502 disposed on the upper surface 401 of the circuit board 410. According to one example embodiment, the first shield can 710 may be electrically connected to the ground part (not shown) of the circuit board 410 or of the sub-circuit board 420. The first shield can 710 may include a ground piece for a connection to the ground part of the circuit board 410 or of the sub-circuit board 420.

According to one example embodiment, the first shield can 710 may cover the connector 600 and the at least one electronic component 501 or 502 disposed on the upper surface 401 of the circuit board 410. The connector 600 and the first shield can 710 may be spaced apart from each other.

According to one example embodiment, the first shield can 710 may include a side wall 701. The first shield can 710 may include the side wall 701 facing a third direction which is different from the first direction 1̂ or the second direction 2̂. The side wall 701 may be formed to surround the inner space of the stacked-PCB substrate. According to one embodiment, the inner space surrounded by the side wall 701 of the first shield can 710 may be substantially sealed. However, when only a shielding effect can be ensured, there may be a minute groove or slit formed on the side wall 701 and thus the inner space may not be sealed.

According to one example embodiment, the connector 600 may be disposed so as not to interfere with the at least one electronic component 501 or 502 disposed on the upper surface 401 of the circuit board 410. The connector 600 may be disposed in an inner space formed by the first shield can 710. For example, the connector 600 may be disposed along the side wall 701 of the first shield can 710. The connector 600 may be physically spaced apart from the first shield can 710. The connector 600 may include multiple layers, and may include conductive terminals which plug conductive vias formed in the multiple layers.

According to one example embodiment, one end of the side wall 701 may be surface-mounted on the upper surface of the circuit board 410, or may be fastened thereto through a fastening structure. The side wall 701 may be electrically connected to the ground part of the circuit board 410. The other end of the side wall 701 may be connected to an extension part 702.

According to one example embodiment, the first shield can 710 may include the extension part 702 extending from the side wall 701. The extension part 702 may be formed to extend from one end of the side wall 701 into the inner space of the stacked-PCB substrate and to be substantially parallel to the sub-circuit board 420. The extension part 702 may be in contact with the lower surface 422 of the sub-circuit board 420. For example, the extension part 702 may be surface-mounted on the sub-circuit board 420 in a reflow process.

According to one example embodiment, the extension part 702 may be formed in various shapes. The extension part 702 may include at least one opening 715 through which the connector 600 such as an interposer can connect the circuit board 410 to the sub-circuit board 420. The first shield can 710 may include an opening so as not to interfere with the connector 600, an electronic component disposed on the upper surface 401 of the circuit board 410, or an electronic component disposed on the lower surface 422 of the sub-circuit board 420. According to various embodiments, the number, size, and shape of the at least one opening 715 may be determined such that the extension part 702 has an adhesion strength strong enough to prevent the first shield can 710 from being warped or unfastened.

According to various example embodiments, the second shield can 720 may be disposed on an upper surface 421 of the sub-circuit board 420. For example, the second shield can 720 may be coupled to the upper surface 421 of the sub-circuit board 420. The second shield can 720 may be connected to the ground part of the sub-circuit board 420 so as to shield an inner space of the PCB structure. According to various embodiments, the inner space surrounding by the second shield can 720 may be substantially sealed. However, when only a shielding effect can be ensured, there may be a minute groove or slit and thus the inner space may not be sealed.

According to one example embodiment, as illustrated in FIG. 5, the conductive frame 700 may form a closed-loop structure. The conductive frame 700 may extend in a shape corresponding to the shape of the circuit board 410 or the sub-circuit board 420. For example, as illustrated in FIG. 5, when each of the circuit board 410 and the sub-circuit board 420 is formed in a generally rectangular shape, the conductive frame 700 may also have a generally rectangular frame structure. Unlike the example illustrated in FIG. 5, when the circuit board 410 or the sub-circuit board 420 has a ㄱ-shape, a L-shape, or a ㄷ-shape, etc. in which the circuit board 410 or sub-circuit board 420 is bent at multiple portions thereof, the conductive frame 700 may have a ㄱ-shape, a L-shape, or a ㄷ-shape, etc. as a whole while forming a closed-loop structure.

Referring to FIG. 6, the example electronic device 400 may include: the printed circuit board 410; at least one electronic component 501 disposed on the printed circuit board 410; the first shield can 710 for covering the at least one electronic component 501; and the connector 600 disposed in a space formed by the first shield can 710 and spaced apart from the side wall of the first shield can 710. Further, the electronic device 400 may include an additional electronic component 511 disposed on the lower surface 402 of the circuit board 410; and an additional shield can 730 for covering the electronic component 511 disposed on the lower surface 402.

According to one embodiment, the first shield can 710 may include the side wall 701 extending in a direction (e.g. direction 1̂ in FIG. 4) perpendicular to the upper surface 401 of the circuit board 410. The side wall 701 may be formed to be perpendicular to the upper surface 401 of the circuit board 410 when the first shield can 710 is coupled to the circuit board 410. In order to prevent interference between the first shield can 710 and the at least one electronic component 501, the side wall 701 may be form to be taller than the at least one electronic component 501. One end of the side wall 701 of the first shield can 710 may be coupled to the upper surface 401 of the circuit board 410, and the other end of the side wall 701 may be connected to the extension part 702. The extension part 702 may extend from the other end of the side wall 701 while being parallel to the circuit board 410. The extension part 702 may be formed so as not to interfere with the at least one electronic component 501.

According to various example embodiments, the connector 600 may include: a first surface 601 formed to be in contact with the circuit board 410; and a second surface 602 opposite to the first surface 601. In order to be electrically connected to the circuit board 410 or the sub-circuit board 420, the connector 600 may include a terminal part disposed on each of the first surface 601 and the second surface 602.

In FIG. 6, the connector 600 and the first shield can 710 may be first coupled to the upper surface 401 of the circuit board 410. However, alternatively, the connector 600 and the first shield can 710 may be first coupled to a sub-circuit board (e.g. the sub-circuit board 420 in FIG. 4). Subsequently, the connector 600 and the first shield can 710 coupled to the sub-circuit board may be coupled to the circuit board 410. According to one embodiment, the extension part 702 of the first shield can 710 may be surface-mounted on the lower surface (e.g. the lower surface 422 in FIG. 5) of the sub-circuit board 420. When the sub-circuit board 420 is coupled to the first shield can 710 through the extension part 702, it is possible to prevent the sub-circuit board 420 and the first shield can 710 from becoming unfastened and to prevent the first shield can 710 from being warped and deformed. The connector 600 may be surface-mounted and coupled to the lower surface 422 of the sub-circuit board 420, or may be physically coupled thereto by a fitting, snap-coupling, or hook-coupling method. When the connector 600 is coupled to the sub-circuit board 420, the connector 600 may be electrically connected to the sub-circuit board 420 by terminals formed on the second surface 602 of the connector 600.

According to various example embodiments, a signal connection terminal exposed through the lower surface 422 of the sub-circuit board 420 may be connected to a terminal formed on the second surface 602 of the connector 600. The first surface 601 of the connector 600 may be connected to a terminal exposed through the upper surface 401 of circuit board 410. The sub-circuit board 420 may be electrically connected to the circuit board 410 via the connector 600, and electronic components disposed on each circuit board may transmit or receive a signal to or from an electronic component, such as a processor, disposed on the circuit board 410 serving as a main substrate.

According to various example embodiments, when the electronic component 511 or a portion affected by noise are positioned on the lower surface 402 of the circuit board 410, the electronic device may include an additional shield can 730 disposed under the circuit board 410. The additional shield can 730 may cover the electronic component 511 disposed on the lower surface 402 of the circuit board 410, and may be disposed in a sealed closed-curve form.

The shield can 730 may be connected to the ground part of the circuit board 410 so as to shield the inner space of the PCB structure. When only a shielding effect can be endured, the shield can 730 may include a minute groove or slit.

The additional shield can 730 may have a frame structure corresponding to the shape of the circuit board 410. Unlike the example illustrated in FIG. 6, when the circuit board 410 has a multi-bent shape, the conductive frame 700 may have a multi-bent shape corresponding to that of the circuit board 410.

According to one example embodiment, the processor may be mounted on the lower surface 402 of the circuit board 410, and the electronic component 501 (e.g. a power management integrated circuit (PMIC)) may be mounted on the upper surface 401. Each electronic component may be shielded by the first shield can 710 and the additional shield can 730. Further, the electronic component 503 is disposed on the upper surface 421 of the sub-circuit board (e.g. the sub-circuit board 420 in FIG. 5), which is in contact with the extension part 702 of the first shield can 710, and may be shielded by the second shield can 720 from an external noise.

According to various example embodiments, the electronic device 400 may include multiple stacked PCBs (the circuit board 410 and the sub-circuit board 420) and the connector 600 configured to electrically connect the multiple circuit boards to each other. The first shield can 710, disposed along the outer periphery of a region in which the connector 600 is disposed, may block electromagnetic waves radiated into the inner space of the first shield can, and may support the sub-circuit board.

Figure 7:
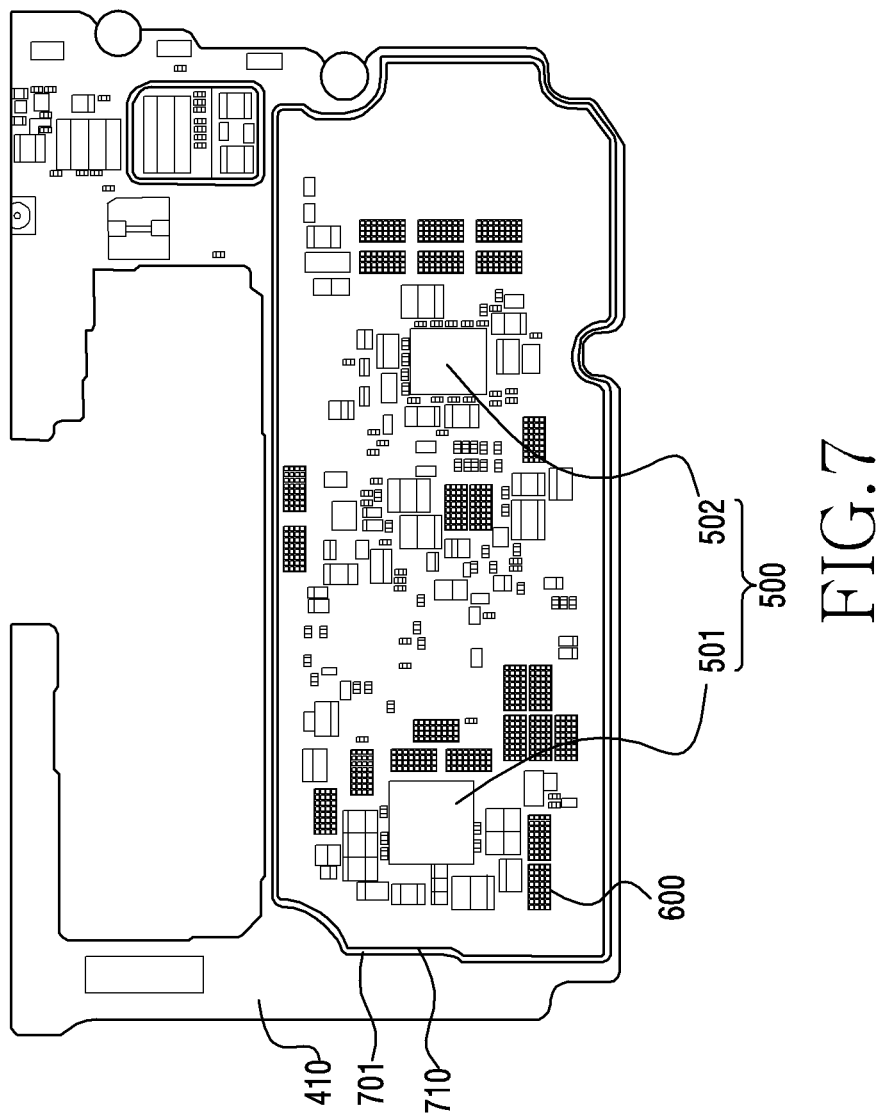
FIG. 7 illustrates a printed circuit board of an example electronic device and components mounted on the printed circuit board according to various embodiments.

FIG. 7 illustrates a printed circuit board of an example electronic device and components mounted on the printed circuit board according to one example embodiment. FIG. 7 illustrates the arrangement of the electronic components 501 and 502, the connector 600, and the first shield can 710, which are disposed on the circuit board 410.

According to one example embodiment, at least one electronic component 501 or 502 may be disposed on the upper surface of the circuit board 410. The connector 600 may be disposed near the at least one electronic component 501 or 502. According to one example embodiment, the connector 600 may be disposed along at least a part of the outer periphery of a region in which the at least one electronic component 501 or 502 is disposed. The side wall 701 of the first shield can 710 may be provided to surround the region in which the connector 600 and the at least one electronic component 501 or 502 are disposed. The shape of the first shield can 710 may be determined according to the shape of the circuit board 410 and the arrangement of the electronic component and the connector 600.

According to one example embodiment, the connector 600 may be disposed along the inner surface of the first shield can 710. For example, the connector 600 may be disposed adjacent to a surface forming the inner space of the first shield can 710. According to one example embodiment, the connector 600 may be positioned between the first shield can 710 and a region in which electronic components are disposed. The number of connectors 600 may be determined according to the number of signal lines necessary between PCBs.

According to one example embodiment, the electronic device includes the first shield can 710 configured to block electromagnetic waves, and thus the connector 600 may not include a separate shielding member. For the same reason, the connector 600 may be disposed in only a part of the region in which electronic components are disposed, without surrounding all of the region.

Figure 8A:
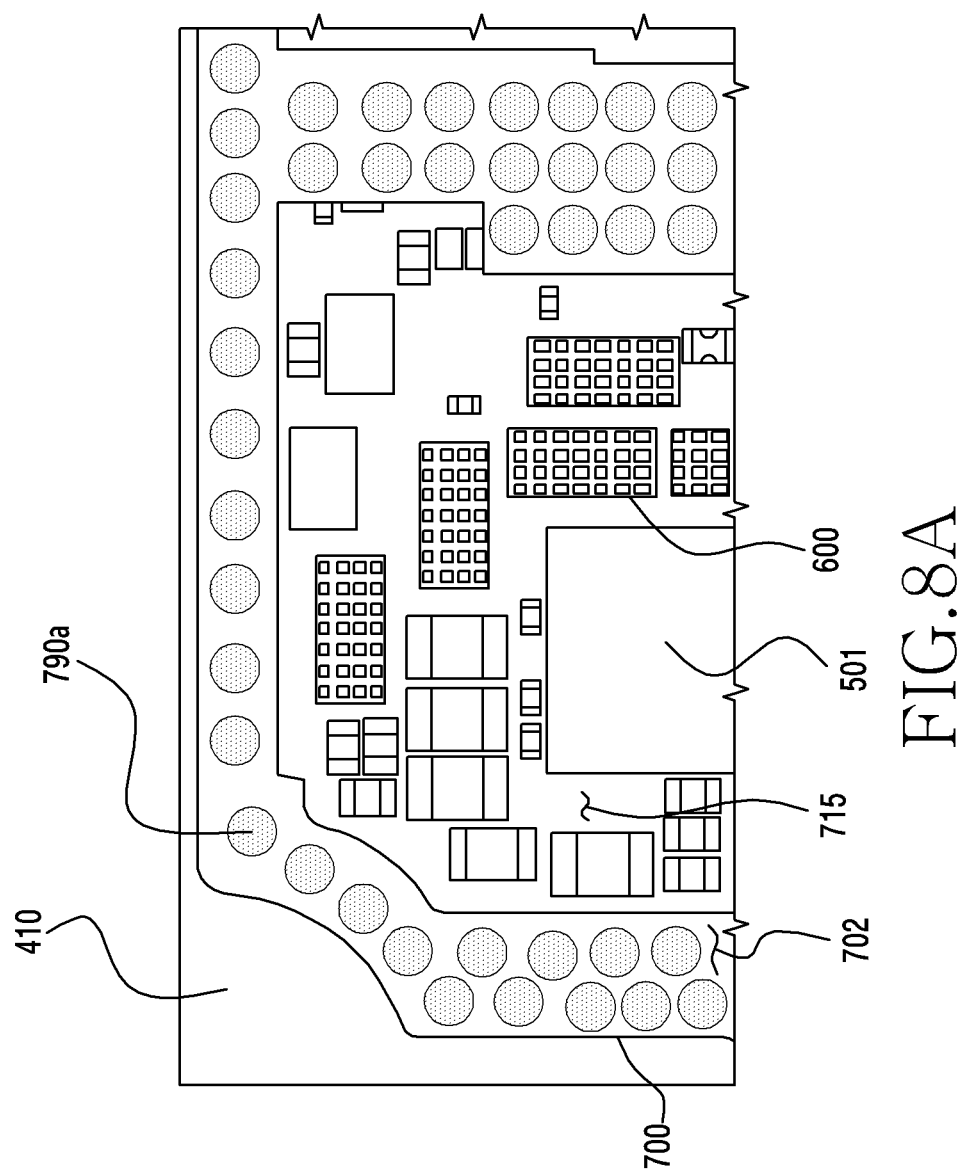
FIGS. 8A and 8B illustrate extension parts of a shield can of example electronic devices according to various embodiments.
Figure 8B:
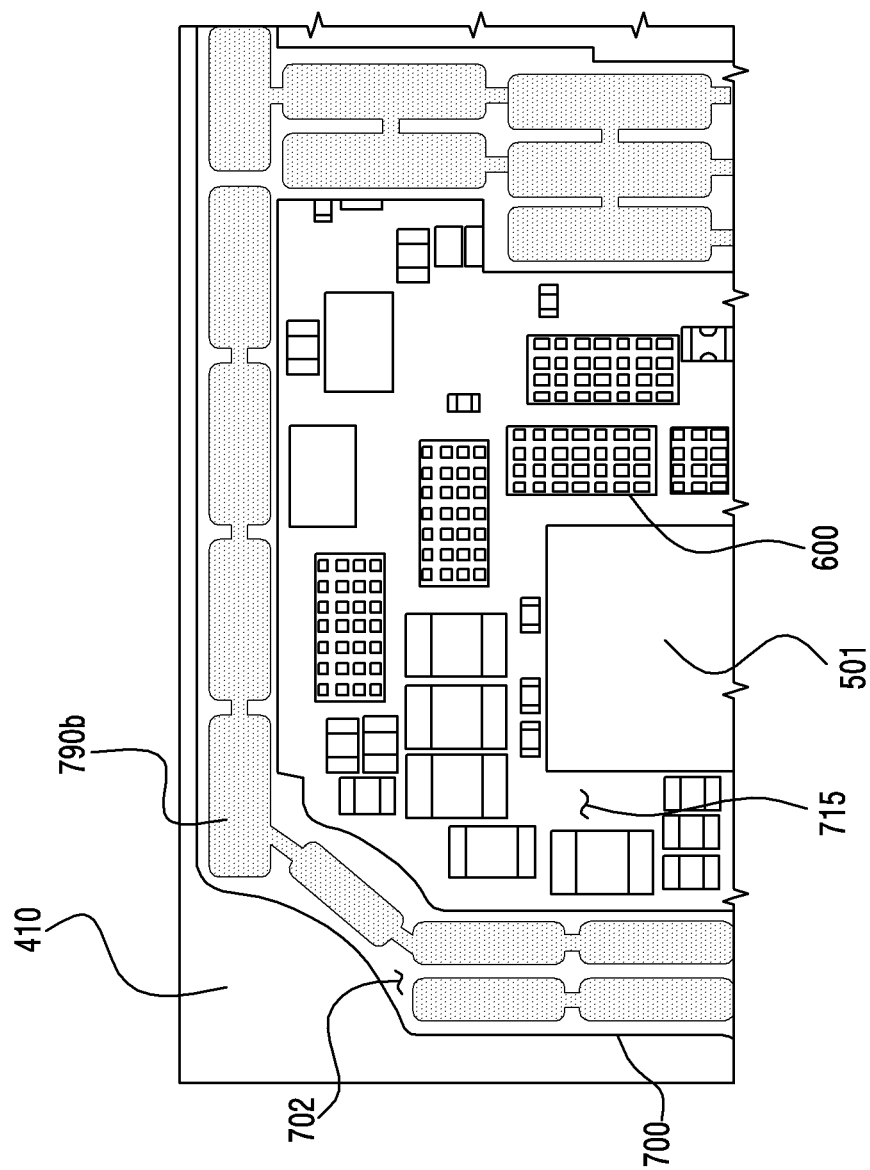

FIG. 8A illustrates an extension part of a shield can of an example electronic device according to one example embodiment. FIG. 8B illustrates an extension part of a shield can of an example electronic device according to one example embodiment.

Referring to FIGS. 8A and 8B, the first shield can(an example, shield can 710 of FIG. 7) disposed on the circuit board 410 may include a solder pad 790*a* or a solder pad 790*b* disposed on the extension part 702. According to various example embodiments, as described above, the extension part 702 may include an opening 715 in order to avoid interference with at least one electronic component 501 or a connector 600. Solders for coupling the extension part to a sub-circuit board 420 may be disposed in a region on the extension part 702, excluding the opening 715. The form of arrangement of the solder pad is not limited to the illustrated arrangements, and may be provided in various forms.

According to various example embodiments, the solder pad 790*a* in FIG. 8A may be formed such that solders are spaced apart from each other. FIG. 8A illustrates that solder pads 790*a* may be spaced apart from each other and formed in a circular shape. However, the shape of the solder pad 790*a* is not limited to a circular shape, and the solder pad 790*a* may be formed in a square shape, a rhombus shape, or various polygonal shapes. The shape of solder may be selected according to the efficiency of a manufacturing process based on surface mounting.

According to various example embodiments, the solder pad 790*b* in FIG. 8B may include a thin connection part located between each solder. Each solder may be shaped to have a length which follows the edge of the extension part 702. Solders spaced apart from each other may be connected to each other by the connection part. According to another example embodiment, some solders may not be connected to each other by the connection part, and thus may be disposed to be separate from each other. The connection between or the shape of solders may be selected according to a surface mounting process.

Hereinafter, various example embodiments of the connector 600 will be described in detail with reference to FIGS. 9A, 9B, 10A, 10B, 10C and 12.

Figure 9A:
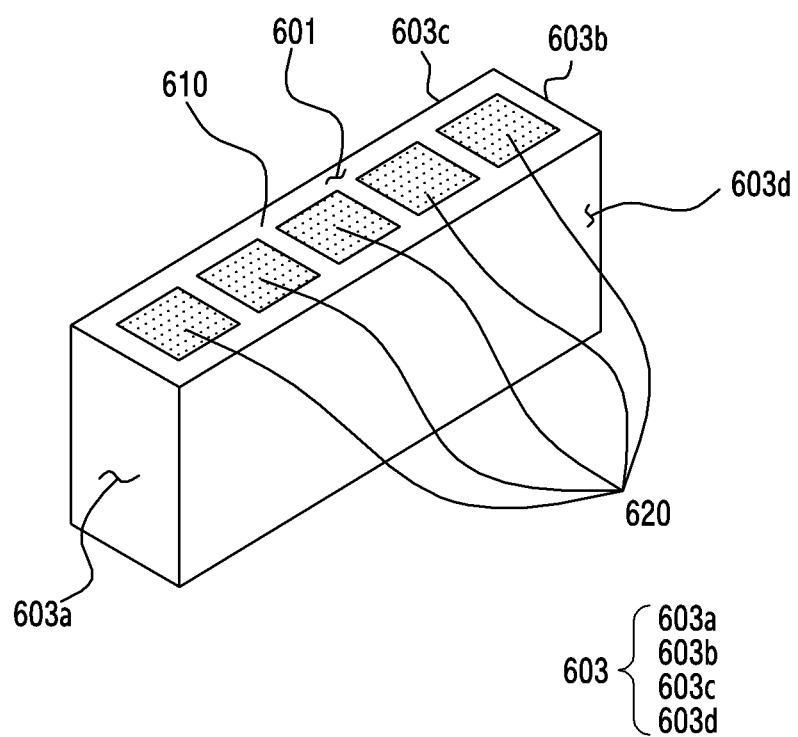
FIGS. 9A and 9B illustrate connectors of example electronic devices according to various embodiments.
Figure 9B:
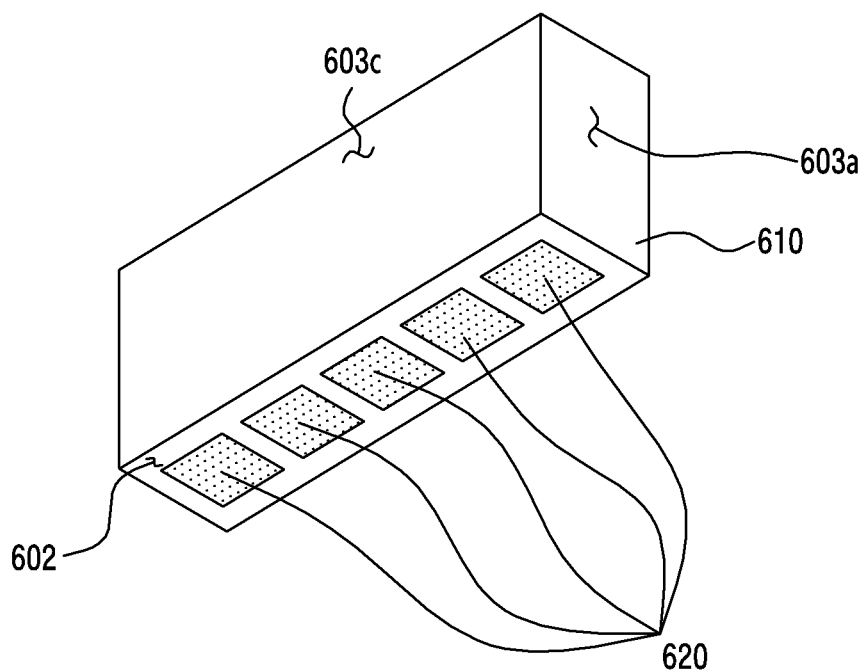

FIG. 9A illustrates a connector of an example electronic device according to one example embodiment. FIG. 9B illustrates a connector of an example electronic device according to one example embodiment.

According to various example embodiments, the connector 600 may include a housing 610 (or a body); and a terminal part 620 including multiple conductive terminals which are received in the housing 610.

The housing 610 may be a PCB type including multiple layers. The housing 610 may be an element forming the entire exterior of the connector 600. The housing 610 may be integrally formed by laminating multiple non-conductive layers. Each of the non-conductive layers may include a via hole formed therethrough. The multiple conductive terminals included in the terminal part 620 may be configured to electrically connect a circuit board (e.g. the circuit board 410 in FIG. 5) to a sub-circuit board (e.g. the sub-circuit board 420 in FIG. 5) or electrically connect the circuit board 410 to an electronic component (e.g. the electronic component 500 in FIG. 5). The terminal part 620 may be formed as a conductive via fitted in the via hole. The terminal part 620 may include multiple terminals formed as multiple vias.

The housing 610 may have an overall shape of a hexahedron. According to one example embodiment, the connector 600 may include: a second surface 602 facing the upper surface (e.g. the upper surface 401 FIG. 4) of a circuit board (e.g. the circuit board 410 in FIG. 4) when being mounted on the circuit board; a first surface 601 facing a direction opposite a direction faced by the second surface 602; and a side surface facing a direction different from the direction faced by the first surface 601 or the second surface 602. The side surface may include a first side surface 603*a*, a second side surface 603*b*, a third side surface 603*c*, and a fourth side surface 603*d*. The side surface may include the first side surface 603*a* and the second side surface 603*b*, which are perpendicular to the longitudinal direction of the housing 610, and the third side surface 603*c* and the fourth side surface 603*d*, which are parallel to the longitudinal direction of the housing 610.

According to various example embodiments, the terminal part 620 may include multiple conductive terminals passing through the terminal part 620 from the first surface 601 to the second surface 602, and the ends of each of the multiple conductive terminals may be exposed from the first surface 601 and the second surface 602, respectively. The multiple conductive terminals exposed through the first surface 601 and the second surface 602 may be electrically connected to the circuit board 410 and the sub-circuit board 420.

Figure 10A:
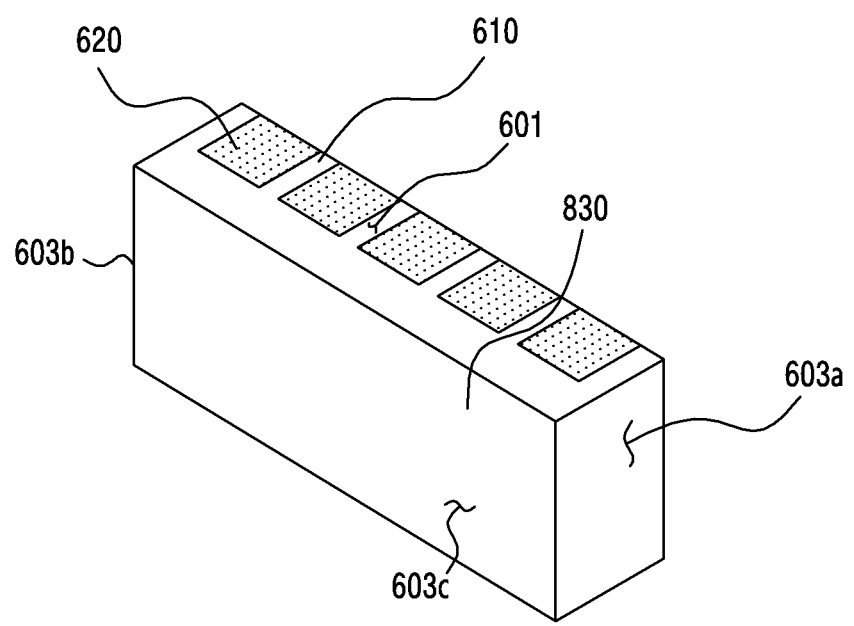
FIGS. 10A, 10B, and 10C illustrate connectors, having terminals exposed from a side surface of a housing thereof, of example electronic devices according to various embodiments.
Figure 10B:
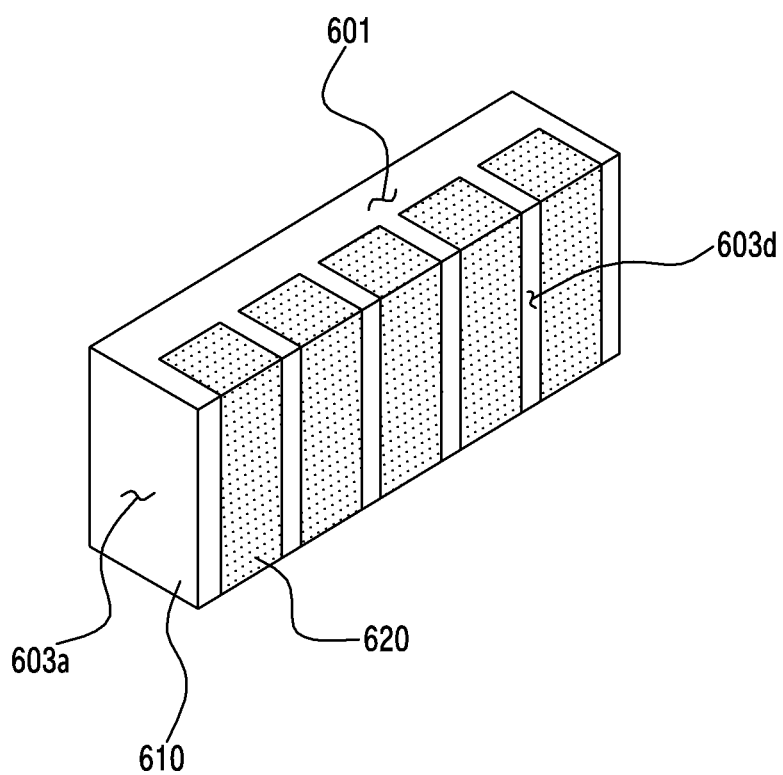
Figure 10C:
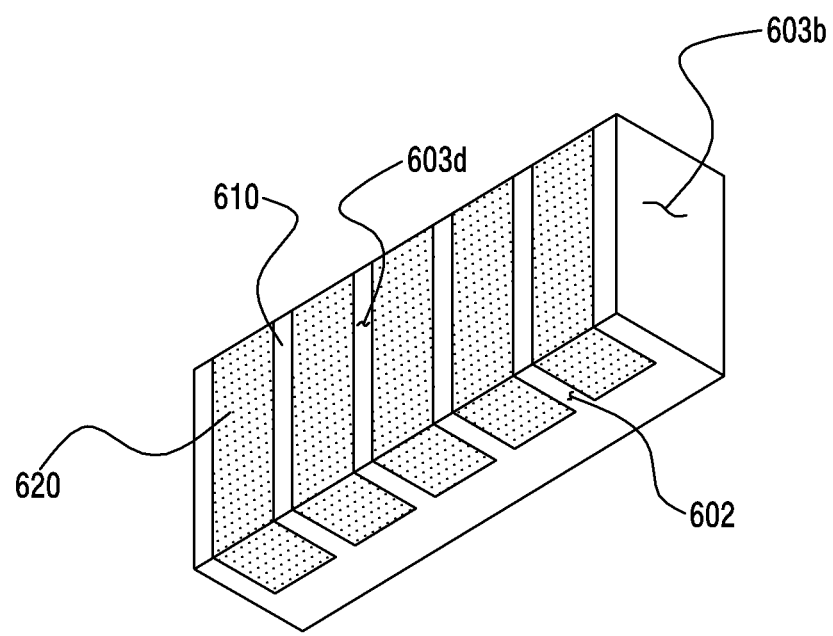

According to various example embodiments, one of the multiple conductive terminals may be a connection terminal, and the remaining terminals may be signal transmission terminals. Alternatively to the embodiment illustrated in FIGS. 9A and 9B, the terminal part 620 may be formed by a combination of various numbers of conductive terminals FIG. 10A illustrates a connector, having terminals exposed from a side surface of a housing thereof, of an example electronic device according to one example embodiment. FIG. 10B illustrates a connector, having terminals exposed from a side surface of a housing thereof, of an example electronic device according to one example embodiment. FIG. 10C illustrates a connector, having terminals exposed from a side surface of a housing thereof, of an example electronic device according to one example embodiment.

Referring to FIGS. 10A, 10B, and 10C, the housing 610 of the connector 600 may have recesses in which terminal parts 620 are stably placed, respectively. The recesses of the housing 610 may formed on the fourth side surface 603*d*, and the terminal parts 620 coupled to the recesses may be partially exposed to the outside.

The terminal part 620 exposed to the outside may be used as a terminal which is connected to an electronic component disposed on a circuit board (e.g. the circuit board 410 in FIG. 5). According to various embodiments, the terminal parts exposed from the fourth side surface 603*d* may be all the terminal parts 620 formed on the connector 600, or may be only some of the terminal parts 620 formed on the connector 600.

FIG. 11A illustrates a printed circuit board (PCB)-type connector (e.g. the connector 600 in FIG. 6) of an example electronic device according to one example embodiment. FIG. 11B is a cross-sectional view taken along line A-A' of the connector in FIG. 11A.

According to one example embodiment, a connector 1100 may include an upper surface 1101, a lower surface 1102, and a side surface surrounding the space between the upper surface 1101 and the lower surface 1102. The side surface of the connector 1100 may include a first side surface 1103, a second side surface 1104 facing the first side surface 1103, and third side surfaces 1105 connecting the first side surface 1103 to the second side surface 1104

The connector 1100 according to one example embodiment may include multiple laminated non-conductive layers. For example, the connector 1100 may include a first layer 1111, a second layer 1112 disposed beneath the first layer 1111, and a third layer 1113 disposed beneath the second layer 1112. Each of the non-conductive layers may include a side surface which surrounds an upper surface, a lower surface, and the space between the upper surface and the lower surface. The side surface of each non-conductive layer may include a first side surface, a second side surface facing the first side surface, and third side surfaces connecting the first side surface to the second side surface. Hereinafter, for ease of description, a first surface to third surfaces of a specific layer may be portions which belong to the first side surface 1103 to the third side surfaces 1105 of the connector 1100, respectively, and correspond to the specific layer. For example, the first side surface of the first layer 1111 may be a portion, which corresponds to first layer 1111, of the first side surface 1103 of the connector 1100, and the first side surface of the second layer 1112 may be a portion, which corresponds to the second layer 1112, of the first side surface 1103 of the connector 1100.

According to one example embodiment, the connector 1100 may include: a first signal pad 1120 exposed from the first side surface 1103; and a second signal pad 1130 exposed from the second side surface 1104 and electrically connected to the first signal pad 1120. The first signal pad 1120 may be connected to the second signal pad 1130 by a conductive pattern 1140. According to one example embodiment, the conductive pattern 1140 may be formed inside the connector 1100 so as not to be exposed out of the connector 1100.

According to one example embodiment, the connector 1100 may include: the first signal pad 1120 exposed from the first side surface 1103 of the first layer 1111; and the second signal pad 1130 exposed from the second side surface 1104 of the first layer 1111 and electrically connected to the first signal pad 1120. The first signal pad 1120 and the second signal pad 1130 may be electrically connected to each other by the conductive pattern 1140. The conductive pattern 1140 may be disposed on the lower surface of the first layer 1111.

According to one example embodiment, the connector 1100 may include: a third signal pad 1150 exposed from the first side surface 1103 of the third layer 1113; and a fourth signal pad 1160 exposed from the second side surface 1104 of the third layer 1113 and electrically connected to the third signal pad 1150. The third signal pad 1150 and the fourth signal pad 1160 may be electrically connected to each other by a second conductive pattern 1170 disposed on the upper surface of the third layer 1113. When the connector 1100 further includes a fourth layer (not shown) disposed beneath the lower surface of the third layer 1113, the second conductive pattern 1170 may be disposed on the lower surface of the third layer 1113.

According to one example embodiment, the non-conductive layer may include a recess formed on a side surface thereof and having a shape corresponding to that of a signal pad. The signal pad may be disposed in the recess formed on the non-conductive side surface. When the signal pad is disposed the recess, a portion of the side surface of the signal pad is in contact with the recess, and the remaining portion of the side surface may be exposed out of the connector 1100. According to one example embodiment, the signal pad may be formed such that a portion of the signal pad, exposed out of the connector 1100, has no step with respect to the non-conductive layer. According to one example embodiment, the portion of the signal pad, exposed out of the connector 1100, may form a portion of the first side surface 1103 of the connector 1100.

According to one example embodiment, the connector 1100 may include a ground layer 1180 which is disposed on the upper surface 1101 and/or the lower surface 1102 of the connector 1100. The ground layer 1180 may be electrically disconnected from the signal pads disposed on the side surface of the connector 1100. For example, the ground layer 1180 may be formed to be spaced apart from the pads.

According to one example embodiment, the connector 1100 may include a ground pad 1190 which is connected to the ground layer 1180 and is exposed from the side surface of the connector 1100. The connector 1100 may include a first ground pad 1190 exposed from the first side surface 1103 and a second ground pad 1191 exposed from the second side surface 1104. The first ground pad 1190 may be electrically connected to the second ground pad 1191 through a conductive pattern formed in the connector 1100.

According to one example embodiment, the ground pads 1190 and 1191 may extend from the upper surface 1101 of the connector 1100 to the lower surface 1102 thereof. Referring to FIG. 11A, for example, the ground pads 1190 and 1191 may extend from the upper of the first layer 1111 to the lower surface of the third layer 1113. The ground pads are not limited to the illustrated embodiment and may be formed on some of the non-conductive layers. For example, the ground pads 1190 and 1191 may extend from the upper surface of the first layer 1111 to the lower surface of the first layer 1111.

FIGS. 11A and 11B illustrate the connector 1100 including three non-conductive layers. However, the number of non-conductive layers constituting the connector 1100 is not limited thereto. Further, signal pads and ground pads are not limited to the illustrated embodiment, and may be variously disposed.

According to one example embodiment, the connector 1100 of a printed circuit board type may be formed by cutting a printed circuit board including a conductive via. For example, the printed circuit board may include: a first conductive via; and a second conductive via connected to the first conductive via through a conductive pattern. The printed circuit board may be cut into: a first cut surface which includes the center axis of the first conductive via; and a second cut surface which includes the center axis of the second conductive via and is parallel to the first cut surface. According to one example embodiment, a cut surface of the first conductive via, exposed from the first cut surface, may serve as one terminal (e.g. the first signal pad 1120) of the connector 1100. A cut surface of the second conductive via, exposed from the second cut surface, may serve as another terminal (e.g. the second signal pad 1130) electrically connected to the one terminal of the connector 1100.

Figure 12:
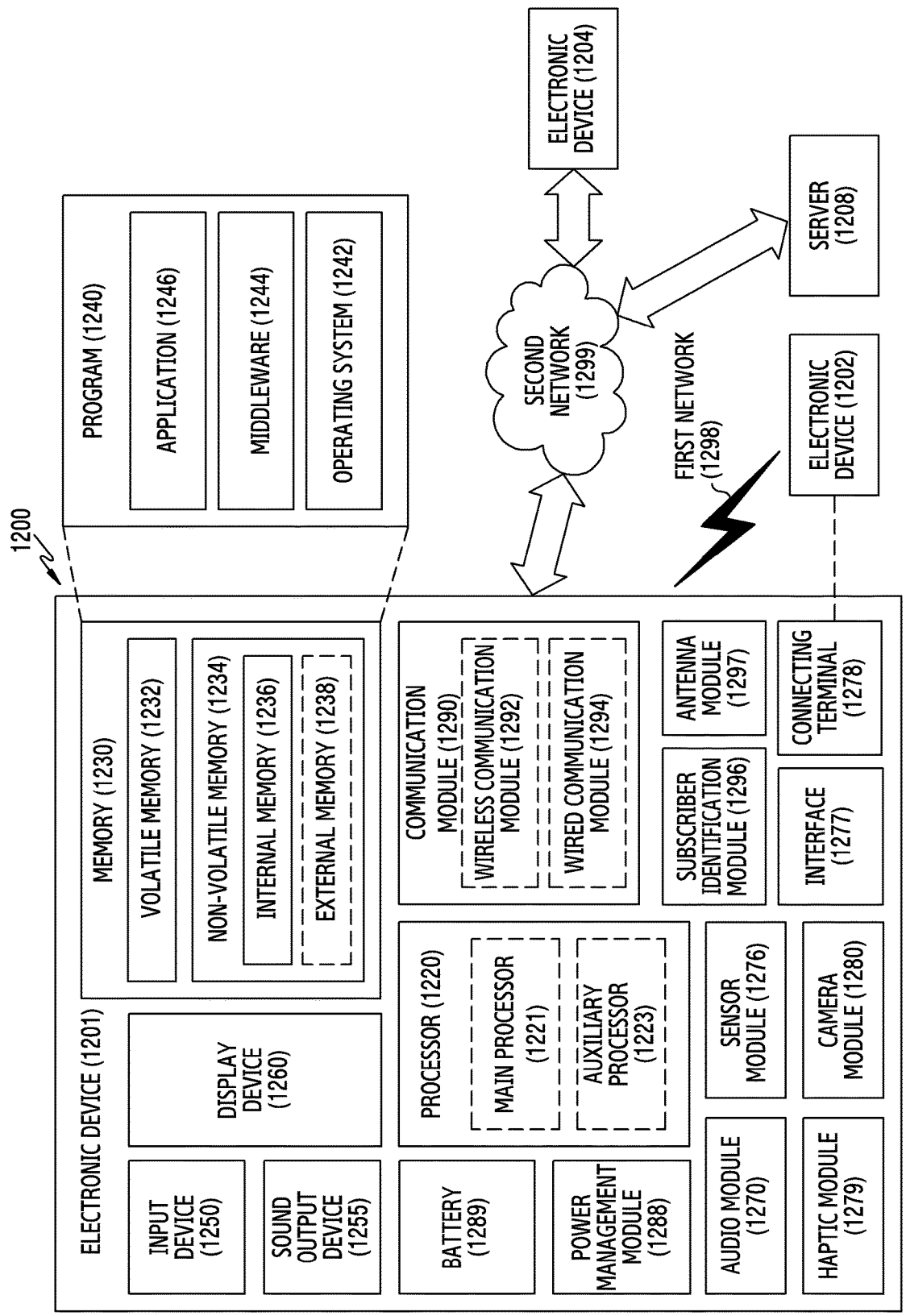
FIG. 12 is a block diagram illustrating an example electronic device in a network environment according to various embodiments.

FIG. 12 illustrate an example electronic device with a number of electronic components that may be placed on more than one circuit board. To keep the electronic device 1201 small, the electronic components may be placed on more than one circuit board.

FIG. 12 is a block diagram illustrating an example electronic device 1201 in a network environment 1200 according to certain example embodiments. Referring to FIG. 12, the electronic device 1201 in the network environment 1200 may communicate with an electronic device 1202 via a first network 1298 (e.g., a short-range wireless communication network), or an electronic device 1204 or a server 1208 via a second network 1299 (e.g., a long-range wireless communication network). According to an example embodiment, the electronic device 1201 may communicate with the electronic device 1204 via the server 1208. According to an example embodiment, the electronic device 1201 may include a processor 1220, memory 1230, an input device 1250, a sound output device 1255, a display device 1260, an audio module 1270, a sensor module 1276, an interface 1277, a haptic module 1279, a camera module 1280, a power management module 1288, a battery 1289, a communication module 1290, a subscriber identification module(SIM) 1296, and/or an antenna module 1297. In some example embodiments, at least one (e.g., the display device 1260 or the camera module 1280) of the components may be omitted from the electronic device 1201, or one or more other components may be added in the electronic device 1201. In some example embodiments, some of the components may be implemented as single integrated circuitry. For example, the sensor module 1276 (e.g., a fingerprint sensor, an iris sensor, or an illuminance sensor) may be implemented as embedded in the display device 1260 (e.g., a display).

The processor 1220 may execute, for example, software (e.g., a program 1240) to control at least one other component (e.g., a hardware or software component) of the electronic device 1201 coupled with the processor 1220, and may perform various data processing or computation. According to one example embodiment, as at least part of the data processing or computation, the processor 1220 may load a command or data received from another component (e.g., the sensor module 1276 or the communication module 1290) in volatile memory 1232, process the command or the data stored in the volatile memory 1232, and store resulting data in non-volatile memory 1234. According to an example embodiment, the processor 1220 may include a main processor 1221 (e.g., a central processing unit (CPU) or an application processor (AP)), and an auxiliary processor 1223 (e.g., a graphics processing unit (GPU), an image signal processor (ISP), a sensor hub processor, or a communication processor (CP)) that is operable independently from, or in conjunction with, the main processor 1221. Additionally or alternatively, the auxiliary processor 1223 may be adapted to consume less power than the main processor 1221, or to be specific to a specified function. The auxiliary processor 1223 may be implemented as separate from, or as part of the main processor 1221.

The auxiliary processor 1223 may control at least some of functions or states related to at least one component (e.g., the display device 1260, the sensor module 1276, or the communication module 1290) among the components of the electronic device 1201, instead of the main processor 1221 while the main processor 1221 is in an inactive (e.g., sleep) state, or together with the main processor 1221 while the main processor 1221 is in an active state (e.g., executing an application). According to an example embodiment, the auxiliary processor 1223 (e.g., an image signal processor or a communication processor) may be implemented as part of another component (e.g., the camera module 1280 or the communication module 1290) functionally related to the auxiliary processor 1223.

The memory 1230 may store various data used by at least one component (e.g., the processor 1220 or the sensor module 1276) of the electronic device 1201. The various data may include, for example, software (e.g., the program 1240) and input data or output data for a command related thereto. The memory 1230 may include the volatile memory 1232 or the non-volatile memory 1234.

The program 1240 may be stored in the memory 1230 as software, and may include, for example, an operating system (OS) 1242, middleware 1244, or an application 1246.

The input device 1250 may receive a command or data to be used by other component (e.g., the processor 1220) of the electronic device 1201, from the outside (e.g., a user) of the electronic device 1201. The input device 1250 may include, for example, a microphone, a mouse, a keyboard, or a digital pen (e.g., a stylus pen).

The sound output device 1255 may output sound signals to the outside of the electronic device 1201. The sound output device 1255 may include, for example, a speaker or a receiver. The speaker may be used for general purposes, such as playing multimedia or playing record, and the receiver may be used for an incoming calls. According to an example embodiment, the receiver may be implemented as separate from, or as part of the speaker.

The display device 1260 may visually provide information to the outside (e.g., a user) of the electronic device 1201. The display device 1260 may include, for example, a display, a hologram device, or a projector and control circuitry to control a corresponding one of the display, hologram device, and projector. According to an example embodiment, the display device 1260 may include touch circuitry adapted to detect a touch, or sensor circuitry (e.g., a pressure sensor) adapted to measure the intensity of force incurred by the touch.

The audio module 1270 may convert a sound into an electrical signal and vice versa. According to an example embodiment, the audio module 1270 may obtain the sound via the input device 1250, or output the sound via the sound output device 1255 or a headphone of an external electronic device (e.g., an electronic device 1202) directly (e.g., wiredly) or wirelessly coupled with the electronic device 1201.

The sensor module 1276 may detect an operational state (e.g., power or temperature) of the electronic device 1201 or an environmental state (e.g., a state of a user) external to the electronic device 1201, and then generate an electrical signal or data value corresponding to the detected state. According to an example embodiment, the sensor module 1276 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1277 may support one or more specified protocols to be used for the electronic device 1201 to be coupled with the external electronic device (e.g., the electronic device 1202) directly (e.g., wiredly) or wirelessly. According to an example embodiment, the interface 1277 may include, for example, a high definition multimedia interface (HDMI), a universal serial bus (USB) interface, a secure digital (SD) card interface, or an audio interface.

A connecting terminal 1278 may include a connector via which the electronic device 1201 may be physically connected with the external electronic device (e.g., the electronic device 1202). According to an example embodiment, the connecting terminal 1278 may include, for example, a HDMI connector, a USB connector, a SD card connector, or an audio connector (e.g., a headphone connector).

The haptic module 1279 may convert an electrical signal into a mechanical stimulus (e.g., a vibration or a movement) or electrical stimulus which may be recognized by a user via his tactile sensation or kinesthetic sensation. According to an example embodiment, the haptic module 1279 may include, for example, a motor, a piezoelectric element, or an electric stimulator.

The camera module 1280 may capture a still image or moving images. According to an example embodiment, the camera module 1280 may include one or more lenses, image sensors, image signal processors, or flashes.

The power management module 1288 may manage power supplied to the electronic device 1201. According to one example embodiment, the power management module 1288 may be implemented as at least part of, for example, a power management integrated circuit (PMIC).

The battery 1289 may supply power to at least one component of the electronic device 1201. According to an example embodiment, the battery 1289 may include, for example, a primary cell which is not rechargeable, a secondary cell which is rechargeable, or a fuel cell.

The communication module 1290 may support establishing a direct (e.g., wired) communication channel or a wireless communication channel between the electronic device 1201 and the external electronic device (e.g., the electronic device 1202, the electronic device 1204, or the server 1208) and performing communication via the established communication channel. The communication module 1290 may include one or more communication processors that are operable independently from the processor 1220 (e.g., the application processor (AP)) and supports a direct (e.g., wired) communication or a wireless communication. According to an example embodiment, the communication module 1290 may include a wireless communication module 1292 (e.g., a cellular communication module, a short-range wireless communication module, or a global navigation satellite system (GNSS) communication module) or a wired communication module 1294 (e.g., a local area network (LAN) communication module or a power line communication (PLC) module). A corresponding one of these communication modules may communicate with the external electronic device via the first network 1298 (e.g., a short-range communication network, such as Bluetooth™, wireless-fidelity (Wi-Fi) direct, or infrared data association (IrDA)) or the second network 1299 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1292 may identify and authenticate the electronic device 1201 in a communication network, such as the first network 1298 or the second network 1299, using subscriber information (e.g., international mobile subscriber identity (IMSI)) stored in the subscriber identification module 1296.

The antenna module 1297 may transmit or receive a signal or power to or from the outside (e.g., the external electronic device) of the electronic device 1201. According to an example embodiment, the antenna module 1297 may include an antenna including a radiating element composed of a conductive material or a conductive pattern formed in or on a substrate (e.g., PCB). According to an example embodiment, the antenna module 1297 may include a plurality of antennas. In such a case, at least one antenna appropriate for a communication scheme used in the communication network, such as the first network 1298 or the second network 1299, may be selected, for example, by the communication module 1290 (e.g., the wireless communication module 1292) from the plurality of antennas. The signal or the power may then be transmitted or received between the communication module 1290 and the external electronic device via the selected at least one antenna. According to an example embodiment, another component (e.g., a radio frequency integrated circuit (RFIC)) other than the radiating element may be additionally formed as part of the antenna module 1297.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 1201 and the external electronic device 1204 via the server 1208 coupled with the second network 1299. Each of the electronic devices 1202 and 104 may be a device of a same type as, or a different type, from the electronic device 1201. According to an example embodiment, all or some of operations to be executed at the electronic device 1201 may be executed at one or more of the external electronic devices 1202, 1204, or 1208. For example, if the electronic device 1201 should perform a function or a service automatically, or in response to a request from a user or another device, the electronic device 1201, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1201. The electronic device 1201 may provide the outcome, with or without further processing of the outcome, as at least part of a reply to the request. To that end, a cloud computing, distributed computing, or client-server computing technology may be used, for example.

The electronic device according to certain example embodiments may be one of various types of electronic devices. The electronic devices may include, for example, a portable communication device (e.g., a smartphone), a computer device, a portable multimedia device, a portable medical device, a camera, a wearable device, or a home appliance. According to an example embodiment of the disclosure, the electronic devices are not limited to those described above.

It should be appreciated that certain example embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 1240) including one or more instructions that are stored in a storage medium (e.g., internal memory 1236 or external memory 1238) that is readable by a machine (e.g., the electronic device 1201). For example, a processor (e.g., the processor 1220) of the machine (e.g., the electronic device 1201) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain example embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain example embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

An electronic device (e.g. the electronic device 400 in FIG. 6) according to one non-limiting, example embodiment may include: a circuit board (e.g. the circuit board 410 in FIG. 4); at least one electronic component (e.g. the electronic component 501, 502, or 503 in FIG. 4) mounted on the upper surface of the circuit board; at least one connector (e.g. the connector 600 in FIG. 4) mounted on the upper surface of the circuit board and electrically connected to the circuit board or the at least one electronic component; and a conductive frame (e.g. the conductive frame 700 in FIG. 4) which includes a side wall (e.g. the side wall 701 in FIG. 4) surrounding a space, in which the at least one electronic component and the at least one connector are disposed, and an extension part (e.g. the extension part 702 in FIG. 4) extending from one end of the side wall into the space.

The electronic device according to one non-limiting example embodiment may further include a sub-circuit board (e.g. the sub-circuit board 420 in FIG. 4) which faces the circuit board and provided to be in contact with the extension part of the conductive frame, wherein the sub-circuit board is electrically connected to the at least one connector.

The at least one connector of the electronic device according to one non-limiting example embodiment may include: multiple layers; and multiple conductive terminals (e.g. the terminal parts 620 in FIG. 10A) passing through the multiple layers, wherein the multiple conductive terminals extend from the circuit board toward the sub-circuit board.

The other end of the side wall of the electronic device according to one non-limiting example embodiment may be surface-mounted on the circuit board by using a solder, and the extension part of the conductive frame may be surface-mounted on the sub-circuit board by using solder.

The conductive frame of the electronic device according to one non-limiting example embodiment may include an opening (e.g. at least one opening 715 in FIG. 4) formed in the extension part.

The electronic device according to one non-limiting example embodiment may further include an electronic component additionally mounted in a region corresponding to the opening.

One surface of the connector of the electronic device according to one non-limiting example embodiment may be surface-mounted on the sub-circuit board by using solder.

Another surface of the connector of the electronic device according to one non-limiting example embodiment may include a fastening member for coupling the connector to the circuit board.

The fastening member of the electronic device according to one non-limiting example embodiment may be coupled to an assembly part formed at the circuit board, and the fastening member and the assembly part may be fixed to each other by fit coupling, snap coupling, or hook coupling.

The connector of the electronic device according to one non-limiting example embodiment may include: a housing; and multiple conductive terminals received in the housing.

The connector of the electronic device according to one non-limiting example embodiment may be surface-mounted on and electrically connected to one surface of the sub-circuit board, and may be electrically connected to one surface of the circuit board by the multiple conductive terminals.

The sub-circuit board of the electronic device according to one non-limiting example embodiment may be disposed to be substantially parallel to the circuit board at a predetermined distance.

The electronic device according to one non-limiting example embodiment may further include a sub-circuit board which faces the circuit board and is provided to be in contact with the extension part, wherein the at least one connector includes: a first non-conductive layer (e.g. the first layer 1111 in FIG. 11); a second non-conductive layer (e.g. the second layer 1112 in FIG. 11) disposed beneath the first non-conductive layer; a ground layer (e.g. the ground layer 1180 in FIG. 11) laminated on the first non-conductive layer; a first conductive pad (e.g. the first signal pad 1120 in FIG. 11) disposed on one side surface (e.g. the first side surface 1103 in FIG. 11) of the first non-conductive layer and electrically disconnected from the ground layer; a second conductive pad (e.g. the second signal pad 1130 in FIG. 11) disposed on another side surface (e.g. the second side surface 1104 in FIG. 11) of the first non-conductive layer and electrically disconnected from the ground layer; and a conductive pattern (e.g. the first conductive pattern 1140 in FIG. 11) disposed between the first non-conductive layer and the second non-conductive layer and configured to electrically connect the first conductive pad to the second conductive pad, wherein the first conductive pad may be surface-mounted on the upper surface of the circuit board by using solder, and the second conductive pad may be surface-mounted on the lower surface of the sub-circuit board by using solder.

An electronic device according to one non-limiting example embodiment may include: a circuit board; a sub-circuit board spaced apart from the circuit board while facing one surface of the circuit board; at least one electronic component mounted on the circuit board; at least one connector which is mounted on the one surface of the circuit board, is electrically connected to the circuit board, the sub-circuit board, or the at least one electronic component, and is disposed between the circuit board and the sub-circuit board; and a conductive frame which includes a side wall surrounding a space, in which the at least one electronic component and the at least one connector are disposed, and an extension part extending from one end of the side wall into the space.

The other end of the side wall of the electronic device according to one non-limiting example embodiment may be surface-mounted on the circuit board by using solder, and the extension part may be surface-mounted on the sub-circuit board by using solder.

The conductive frame of the electronic device according to one non-limiting example embodiment may include an opening formed in the extension part.

The electronic device according to one non-limiting example embodiment may further include an electronic component additionally mounted in a region of the circuit board, which corresponds to the opening.

The electronic component of the electronic device according to one non-limiting example embodiment may include a processor or a power management module.

The electronic device according to one non-limiting example embodiment may further include a radio frequency integrated circuit (RFIC) disposed on a surface facing the extension part with reference to the sub-circuit board.

The at least one connector of the electronic device according to one non-limiting example embodiment may include: multiple layers; and multiple conductive terminals passing through the multiple layers, wherein the multiple conductive terminals extend from the circuit board toward the sub-circuit board.

The scope of protection is defined by the appended independent claims. Further features are specified by the appended dependent claims. Example implementations can be realized comprising one or more features of any claim taken jointly and severally in any and all permutations.

The examples described in this disclosure include non-limiting example implementations of components corresponding to one or more features specified by the appended independent claims and these features (or their corresponding components) either individually or in combination may contribute to ameliorating one or more technical problems deducible by the skilled person from this disclosure.

Furthermore, one or more selected component of any one example described in this disclosure may be combined with one or more selected component of any other one or more example described in this disclosure, or alternatively may be combined with features of an appended independent claim to form a further alternative example.

Further example implementations can be realized comprising one or more components of any herein described implementation taken jointly and severally in any and all permutations. Yet further example implementations may also be realized by combining features of one or more of the appended claims with one or more selected components of any example implementation described herein.

In forming such further example implementations, some components of any example implementation described in this disclosure may be omitted. The one or more components that may be omitted are those components that the skilled person would directly and unambiguously recognize as being not, as such, indispensable for the function of the present technique in the light of a technical problem discernible from this disclosure. The skilled person would recognize that replacement or removal of such an omitted components does not require modification of other components or features of the further alternative example to compensate for the change. Thus further example implementations may be included, according to the present technique, even if the selected combination of features and/or components is not specifically recited in this disclosure.

Two or more physically distinct components in any described example implementation of this disclosure may alternatively be integrated into a single component where possible, provided that the same function is performed by the single component thus formed. Conversely, a single component of any example implementation described in this disclosure may alternatively be implemented as two or more distinct components to achieve the same function, where appropriate.

Methods disclosed in the claims and/or methods according to various example embodiments described in the specification of the disclosure may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Alternatively, any combination of some or all of them may form a memory in which the program is stored. Further, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access the electronic device via an external port. Further, a separate storage device on the communication network may access a portable electronic device.

In the above-described detailed embodiments of the disclosure, an element included in the disclosure is expressed in the singular or the plural according to presented detailed embodiments. However, the singular form or plural form is selected appropriately to the presented situation for the convenience of description, and the disclosure is not limited by elements expressed in the singular or the plural. Therefore, either an element expressed in the plural may also include a single element or an element expressed in the singular may also include multiple elements.

While the disclosure has been illustrated and described with reference to various example embodiments, it will be understood that the various example embodiments are intended to be illustrative, not limiting. It will be further understood by one of ordinary skill in the art that various changes in form and detail may be made without departing from the true spirit and full scope of the disclosure, including the appended claims and their equivalents.

What is claimed is:
1. An electronic device comprising:
a circuit board;
at least one electronic component mounted on an upper surface of the circuit board;
at least one connector mounted on the upper surface of the circuit board and electrically connected to the circuit board or the at least one electronic component;
a conductive frame which comprises a side wall surrounding a space in which the at least one electronic component and the at least one connector are disposed, and an extension part extending from a first end of the side wall into the space; and
a sub-circuit board which faces the circuit board and is disposed to be in contact with the extension part of the conductive frame, wherein the sub-circuit board is electrically connected to the at least one connector,
wherein the at least one connector comprises multiple layers and multiple conductive terminals passing through the multiple layers, wherein the multiple conductive terminals extend from the circuit board toward the sub-circuit board, and
wherein a second end wall of the side wall is surface mounted on the circuit board.

2. The electronic device of claim 1, wherein the extension part is surface-mounted on the sub-circuit board.

3. The electronic device of claim 1, wherein the extension part comprises an opening.

4. The electronic device of claim 3, wherein the at least one electronic component includes an electronic component disposed in correspondence with the opening.

5. The electronic device of claim 1, wherein a first surface of the at least one connector is surface-mounted on the sub-circuit board.

6. The electronic device of claim 5, wherein a second surface of the at least one connector comprises a fastener for coupling the connector to the circuit board.

7. The electronic device of claim 6, wherein the fastener is coupled to an assembly part at the circuit board, wherein the fastener and the assembly part are fixed to each other by fit coupling, snap coupling, or hook coupling.

8. The electronic device of claim 1, wherein the at least one connector comprises a housing, and the multiple conductive terminals are disposed in the housing.

9. The electronic device of claim 8, wherein the at least one connector is surface-mounted on and electrically connected to a first surface of the sub-circuit board, and is electrically connected to a first surface of the circuit board by the multiple conductive terminals.

10. The electronic device of claim 1, wherein the sub-circuit board is disposed to be substantially parallel to the circuit board at a distance therefrom.

11. The electronic device of claim 1, wherein the at least one connector comprises:
a first non-conductive layer;
a second non-conductive layer disposed beneath the first non-conductive layer;
a ground layer laminated on the first non-conductive layer;
a first conductive pad disposed on one side surface of the first non-conductive layer and electrically disconnected from the ground layer;
a second conductive pad disposed on another side surface of the first non-conductive layer and electrically disconnected from the ground layer; and
a conductive pattern disposed between the first non-conductive layer and the second non-conductive layer and configured to electrically connect the first conductive pad to the second conductive pad,
wherein the first conductive pad is surface-mounted on the upper surface of the circuit board, and
wherein the second conductive pad is surface-mounted on a lower surface of the sub-circuit board.

12. The electronic device of claim 1, wherein the conductive frame comprises a first shield can and a second shield can.

13. An electronic device comprising:
a circuit board;
a sub-circuit board spaced apart from the circuit board and facing a first surface of the circuit board;
at least one electronic component mounted on the circuit board;
at least one connector which is mounted on the first surface of the circuit board, is electrically connected to the circuit board, the sub-circuit board, or the at least one electronic component, and is disposed between the circuit board and the sub-circuit board; and
a conductive frame which comprises a side wall surrounding a space, in which the at least one electronic component and the at least one connector are disposed, and an extension part extending from a first end of the side wall into the space,
wherein the at least one connector comprises: multiple layers; and multiple conductive terminals passing through the multiple layers, wherein the multiple conductive terminals extend from the circuit board toward the sub-circuit board.

14. The electronic device of claim 13, wherein a second end of the side wall is surface-mounted on the circuit board, and wherein the extension part is surface-mounted on the sub-circuit board.

15. The electronic device of claim 13, wherein the conductive frame comprises an opening formed in the extension part.

16. The electronic device of claim 15, further comprising an electronic component additionally mounted in a region of the circuit board, which corresponds to the opening.

17. The electronic device of claim 13, wherein the at least one electronic component comprises a processor or a power management module.

18. The electronic device of claim 13, further comprising a radio frequency integrated circuit (RFIC) disposed on a surface facing the extension part with reference to the sub-circuit board.

* * * * *